United States Patent
Mizuhara et al.

(10) Patent No.: US 6,288,438 B1
(45) Date of Patent: Sep. 11, 2001

(54) SEMICONDUCTOR DEVICE INCLUDING INSULATION FILM AND FABRICATION METHOD THEREOF

(75) Inventors: Hideki Mizuhara; Hiroyuki Watanabe, both of Aichi; Noriaki Kojima, Gifu, all of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 08/923,901

(22) Filed: Sep. 4, 1997

(30) Foreign Application Priority Data

Sep. 6, 1996 (JP) .................................................. 8-236799
Dec. 25, 1996 (JP) .................................................. 8-345586

(51) Int. Cl.$^7$ .................................................. H01L 23/58
(52) U.S. Cl. .......................... 257/634; 257/760; 438/623; 438/783
(58) Field of Search .................................. 438/623, 624, 438/783; 257/760, 634, 635

(56) References Cited

U.S. PATENT DOCUMENTS

| | | | |
|---|---|---|---|
| 3,747,203 | 7/1973 | Shannon | 29/578 |
| 4,676,867 | 6/1987 | Elkins et al. | 156/643 |
| 4,775,550 | 10/1988 | Chu et al. | 427/38 |
| 4,885,262 | 12/1989 | Ting et al. | 437/231 |
| 4,962,052 | 10/1990 | Asayama et al. | 438/234 |
| 4,983,546 | 1/1991 | Hyun et al. | 437/231 |
| 4,984,055 | * 1/1991 | Okumura et al. | 357/49 |

(List continued on next page.)

FOREIGN PATENT DOCUMENTS

| | | | |
|---|---|---|---|
| 4218495 A1 | 12/1992 | (DE) . | |
| 56-125844 | * 10/1981 | (JP) | H01L/21/306 |
| 58031519 A | 2/1983 | (JP) . | |
| 59017243 A | 1/1984 | (JP) . | |
| 62-60242 | 3/1987 | (JP) . | |

(List continued on next page.)

OTHER PUBLICATIONS

Twelfth International VLSI Multilevel Interconnection Conference (VMIC); 1995 Proceedings; Jun. 27–29, Santa Clara, CA, 1995.
*Lithography 1: Optical Resist Materials and Process Technology*, pp. 441.
Wang et al., "A Study of Plasma Treatments on Siloxane SOB," IEEE VMIC Conference, Jun. 7–8, 1994, pp. 101–107.
Chiang et al., Defects Study on Spin on Glass Planarization Technology, IEEE VMIC Conference, Jun. 15–16, 1987, pp. 404–412.
Lai–Juh Chen, et al., "Fluorine–Implanted Treatment (FIT) SOG for the Non–Etchback Intermetal Dielectric," IEEE VMIC Conference, Jun. 7–8, 1994, pp. 81–86.
Moriya et al., "Modification Effects in Ion–Implanted SiO$_2$ Spin–on–Glass," *J. Electrochem. Soc.*, vol. 140, No. 5, May 1993, pp. 1442–1450.

(List continued on next page.)

*Primary Examiner*—Caridad Everhart
(74) *Attorney, Agent, or Firm*—Armstrong, Westerman, Hattori, McLeland & Naughton, LLP

(57) ABSTRACT

A semiconductor device that allows improvement in adhesion between insulation films having a 2-layered structure together with improvement of planarization and film characteristics, and a fabrication method thereof are obtained. In the fabrication method of the semiconductor device, an insulation film of a 2-layered structure having at least an upper layer and a lower layer is formed on a semiconductor substrate. Then, impurities are introduced into the upper insulation film under a condition where impurities arrive at least at the interface between the upper insulation film and the lower insulation film. By improving the adhesion between the upper and lower insulation films, the upper insulation film does not easily peel off.

15 Claims, 15 Drawing Sheets

U.S. PATENT DOCUMENTS

| | | | |
|---|---|---|---|
| 5,003,062 | 3/1991 | Yen | 437/231 |
| 5,084,412 | 1/1992 | Nakasaki . | |
| 5,087,589 | 2/1992 | Chapman . | |
| 5,106,787 | 4/1992 | Yen | 437/231 |
| 5,153,680 | 10/1992 | Naito et al. | 357/8 |
| 5,166,768 | 11/1992 | Ito | 257/523 |
| 5,186,745 | 2/1993 | Maniar . | |
| 5,192,697 * | 3/1993 | Leong . | |
| 5,314,834 | 5/1994 | Mazuré et al. | 437/43 |
| 5,341,026 | 8/1994 | Harada et al. . | |
| 5,352,630 | 10/1994 | Kim et al. | 437/195 |
| 5,404,046 | 4/1995 | Matsumoto et al. | 257/750 |
| 5,429,990 * | 7/1995 | Liu et al. . | |
| 5,468,684 | 11/1995 | Yoshimori et al. | 437/228 |
| 5,479,054 | 12/1995 | Tottori . | |
| 5,496,776 | 3/1996 | Chien et al. . | |
| 5,514,910 | 5/1996 | Koyama . | |
| 5,549,786 | 8/1996 | Jones et al. | 156/662.1 |
| 5,569,618 | 10/1996 | Matsubara . | |
| 5,581,101 * | 12/1996 | Ning et al. | 257/347 |
| 5,607,880 * | 3/1997 | Suzuki et al. . | |
| 5,665,845 | 9/1997 | Allman . | |
| 5,702,568 | 12/1997 | Shin et al. . | |
| 5,753,975 | 5/1998 | Matsuno . | |
| 5,786,273 | 7/1998 | Hibi et al. | 438/637 |
| 5,817,582 | 10/1998 | Maniar . | |
| 5,855,962 | 1/1999 | Cote et al. . | |
| 5,866,476 | 2/1999 | Choi et al. . | |
| 5,892,269 | 4/1999 | Inoue et al. | 257/634 |
| 5,898,221 | 4/1999 | Mizuhara et al. | 257/751 |
| 5,930,624 | 7/1999 | Murata et al. | 438/253 |
| 5,963,827 | 10/1999 | Enomoto et al. | 438/629 |
| 6,013,578 | 1/2000 | Jun | 438/687 |
| 6,071,807 * | 6/2000 | Watanabe et al. | 438/623 |

FOREIGN PATENT DOCUMENTS

| | | | |
|---|---|---|---|
| 2-26055 | 7/1988 | (JP) | H01L/21/90 |
| 1-199456 | 8/1989 | (JP) . | |
| 01199456 * | 10/1989 | (JP) . | |
| 1-307247 | 12/1989 | (JP) . | |
| 2-26055 | 1/1990 | (JP) . | |
| 2-7451 | 1/1990 | (JP) . | |
| 2-101532 | 8/1990 | (JP) . | |
| 2-235358 | 9/1990 | (JP) . | |
| 02235358 * | 9/1990 | (JP) . | |
| 2-253643 | 10/1990 | (JP) . | |
| 3-101130 | 4/1991 | (JP) . | |
| 4-234149 | 8/1992 | (JP) . | |
| 4-307934(A) | 10/1992 | (JP) . | |
| 4-317358 | 11/1992 | (JP) . | |
| 5-226334 | 3/1993 | (JP) . | |
| 5-74963 | 3/1993 | (JP) . | |
| 5-198523 | 8/1993 | (JP) . | |
| 5-226334 | 9/1993 | (JP) . | |
| 6-275229 | 9/1994 | (JP) . | |
| 6-291202 * | 10/1994 | (JP) | H01L/21/90 |
| 6-349950 | 12/1994 | (JP) . | |
| 7-99195 | 4/1995 | (JP) . | |
| 8-17770 | 1/1996 | (JP) . | |
| 8-64561 | 3/1996 | (JP) . | |
| 8-241891 | 9/1996 | (JP) . | |
| 9-330982 | 12/1997 | (JP) . | |
| 10209147 | 8/1998 | (JP) . | |
| 63-192359 | 8/1998 | (JP) . | |
| 63-198359 * | 8/1998 | (JP) | H01L/21/90 |
| 10303295 A | 11/1998 | (JP) . | |

OTHER PUBLICATIONS

Matsuura et al., "An Advanced Interlayer Dielectric System with Partially Converted Organic SOG Using Plasma Treatment," IEEE VMIC Conference, Jun. 8–9, 1993, pp. 113–115.

Ishida et al., "Mechanism for AlSiCu alloy Corrosion," *Jpn. J. Appl. Phys.*, vol. 31 (1992), pp. 2045–2048.

Doki et al., "Moisture–Blocking Mechanism of ECR–Plasma," IEEE VMIC Conference, Jun. 7–8, 1994, pp. 235–139.

Shimokawa et al., "Suppression of MOSFET hot carrier degradation by P–SiO underLayer," *The Institute of Electronics, Information and Communication Engineers*, Technical Report of IEICE, SDM92–133 (1992–12), pp. 89–94.

Murase et al., "Dielectric Constant of Silicon Dioxide Deposited by Atmospheric–Pressure Chemical Vapor Deposition Using Tetraethylorthosilicate and Ozone," *Jpn. J. Appl. Phys.*, vol. 33 (1994), pp. 1385–1389.

* cited by examiner

- ■ : B⁺ 20~140keV 1E15cm⁻²／SOG FILM THICKNESS 600nm
- ◆ : B⁺ 140keV 1E14~1E15cm⁻²／SOG FILM THICKNESS 600nm
- ● : B⁺ 140keV 1E15cm⁻²／SOG FILM THICKNESS 300~900nm
- ▲ : Ar⁺ 140keV 1E12~1E16cm⁻²／SOG FILM THICKNESS 300nm

SEMICONDUCTOR DEVICE INCLUDING INSULATION FILM AND FABRICATION METHOD THEREOF

BACKGROUND OF THE INVENTION

1. Field of the Invention

The present invention relates to a semiconductor device and a fabrication method thereof. More particularly, the present invention relates a semiconductor device including an insulation film and a method of fabrication thereof.

2. Description of the Background Art

In the past years, intensive efforts have been taken to reduce the size of interconnections and provide multilayers for the purpose of further increasing the integration density of semiconductor integrated circuit devices. An interlayer insulation film is provided between each interconnection to obtain a multilayer structure of the interconnection. If the surface of this interlayer insulation film is not planar, a step-graded portion will be generated at the interconnection formed above the interlayer insulation film. This will cause defects such as disconnection. Therefore, the surface of the interlayer insulation film (the surface of the device) must be made as flat as possible. The technique to planarize the surface of the device is called planarization. This planarization technique has become important in reducing the size and providing multilayers of the interconnection.

In planarization, an SOG (Spin On Glass) film is known as an interlayer insulation film that is generally used. Recently, development in the planarization technique taking advantage of fluidity of a material of the interlayer insulation film is particularly noticeable.

An "SOG" is a generic term of a film mainly composed of a solution in which a silicon compound is dissolved in an organic solvent, and silicon dioxide formed from that solution.

In forming an SOG film, first a solution having a silicon compound dissolved in an organic solvent is applied in droplets on a rotated substrate. By this rotation, the solution coating is provided so as to alleviate the step-graded portion on the substrate corresponding to the interconnection. More specifically, the coating is formed thick at the concave portion and thin at the convex portion on the substrate. As a result, the surface of the solution coating is planarized.

Then, heat treatment is applied to vaporize the organic solvent. Also, polymerization proceeds to result in a planarized SOG film at the surface.

An SOG film is typically classified into an inorganic SOG film that does not include any organic component in a silicon compound, as represented by the following general formula (1), and an organic SOG film including an organic component in a silicon compound, as represented by the following general formula (2).

$$[SiO_2]n \qquad (1)$$

$$[R_X SiO_Y]n \qquad (2)$$

(n, X, Y: integer; R: alkyl group or aryl group)

An inorganic SOG film includes a great amount of moisture and hydroxyl group. It is more brittle than a silicon oxide film formed by CVD (Chemical Vapor Deposition). There was a disadvantage that a crack is easily generated during the heat treatment when the thickness of the inorganic SOG film is greater than 0.5 µm.

In contrast, an organic SOG film does not have any cracks generated during the heat treatment, and the film thickness can be set to approximately 0.5–1 µm. Therefore, the usage of an organic SOG film allows the formation of a thicker interlayer insulation film. This means that sufficient planarization can be achieved even for a great step-graded portion on a substrate.

As described above, inorganic and organic SOG films have superior planarization. However, the great amount of moisture and hydroxyl group included in an inorganic SOG film will adversely affect a metal interconnection and the like to induce the problem of degrading the electrical characteristics and the action of corrosion.

A similar problem is seen in an organic SOG film. This is because, though smaller in comparison to an inorganic SOG film, the organic SOG film includes some amount of moisture and hydroxyl group.

To compensate for this disadvantage when an SOG film is employed as an interlayer insulation film, an insulation film such as a silicon oxide film formed by, for example, plasma CVD having the characteristics of insulation and mechanical strength in addition to the property of blocking moisture and hydroxyl group is provided above or beneath the SOG film.

However, the adhesion between such a silicon oxide film and an SOG film is poor. There was a disadvantage that they will peel away from each other after or during the fabrication process. This peel off will result in deterioration in the insulation characteristics to degrade the reliability of the device.

SUMMARY OF THE INVENTION

An object of the present invention is to provide a semiconductor device that allows the adhesion intensity between an upper insulation film and a lower insulation film to be improved.

Another object of the present invention is to provide a fabrication method to facilitate fabrication of a semiconductor device that allows improvement of the adhesion intensity between an upper insulation film and a lower insulation film.

A further object of the present invention is to provide a method of fabricating a semiconductor device that can have interconnection resistance of a metal interconnection layer located under an insulation film reduced.

A method of fabricating a semiconductor device according to an aspect of the present invention includes the following steps. First, an insulation film of a 2-layered structure of at least an upper layer and a lower layer is formed on a semiconductor substrate. Impurities are introduced to the upper insulation film under the condition that the impurities arrive at least to the interface between the upper insulation film and the lower insulation film. Accordingly, the adhesion intensity between the upper insulation film and the lower insulation film can be improved. By implanting ions into the upper insulation film, the characteristic of the upper insulation film can be modified. The moisture and hydroxyl group included in that insulation film can be reduced. Also, that insulation film becomes less hygroscopic.

A method of fabricating a semiconductor device according to another aspect of the present invention includes the following steps. First, a first insulation film is formed on a semiconductor substrate. A second insulation film is formed on the first insulation film. Impurities having kinetic energy are introduced into the second insulation film under a condition where the impurities reach at least the interface between the second insulation film and the first insulation film. Accordingly, the adhesion intensity between the second insulation film and the first insulation film can be improved.

By introducing impurities into the second insulation film, the second insulation film can be modified. The moisture and hydroxyl group included in the second insulation film is reduced. Also, the second insulation film becomes less hygroscopic. According to the above structure, a third insulation film can be formed on the second insulation film. Impurities are introduced preferably under the condition that the number of impurities passing through the interface is at least $2 \times 10^{13}$ atoms/cm$^2$ and not more than $2 \times 10^{18}$ atoms/cm$^2$. The second insulation film can include any of a silicon oxide film containing at least 1% of carbon, an organic polymer, or an inorganic SOG film. The first insulation film preferably includes a film that is less hygroscopic than the second insulation film. Also, the impurities with kinetic energy are preferably introduced by ion-implantation. Furthermore, the impurities are preferably boron or argon ions.

A method of fabricating a semiconductor device according to a further aspect of the present invention includes the following steps. First, an insulation film having a 2-layered structure of at least an upper layer and a lower layer is formed on a metal interconnection layer formed on a semiconductor substrate. Impurities are introduced into the upper insulation film under the condition where the impurities pass through the interface between the upper insulation film and the lower insulation film and reach the metal interconnection layer. By implanting impurities to the upper insulation film so as to arrive at the metal interconnection layer, the interconnection resistance of the metal interconnection layer can be reduced. This provides the advantage that the metal interconnection layer can be made thinner.

A method of fabricating a semiconductor device according to still another aspect of the present invention includes the following steps. First, a metal interconnection layer is formed on a semiconductor substrate. A first insulation film is formed on the metal interconnection layer. A second interconnection film is formed on the first insulation film. Impurities with kinetic energy are introduced into the second insulation film under the condition where the impurities pass through the interface between the second insulation film and the first insulation film to arrive at the metal interconnection layer. By introducing impurities with kinetic energy to the second insulation film under the condition that the impurities reach the metal interconnection layer, the interconnection resistance of the metal interconnection layer can be reduced. As a result, the metal interconnection layer can be made thinner. This facilitates microfabrication. A third insulation film can be formed on the second insulation film. The metal interconnection layer can include a titanium layer. Also, the metal interconnection layer may have a structure including a main interconnection layer and a titanium layer formed on that main interconnection layer. Furthermore, the metal interconnection layer may have a structure including a main interconnection layer, a titanium layer formed on the main interconnection layer, and a titanium nitride layer formed on that titanium layer. The main interconnection layer preferably includes a simple substance of aluminum or an aluminum alloy. Also, it is preferable to introduce impurities under a condition so that the number of impurities passing through the interface is at least $2 \times 10^{13}$ atoms/cm$^2$ and not more than $2 \times 10^{18}$ atoms/cm. The second insulation film may include any of a silicon oxide film containing at least 1% of carbon, an organic polymer, and an inorganic SOG film. The first insulation film preferably includes a film less hygroscopic than the second insulation film. Furthermore, impurities with kinetic energy are introduced preferably by ion-implantation. Impurities are preferably boron ions or argon ions.

A semiconductor device according to a still further aspect of the present invention includes a first insulation film formed on a semiconductor substrate and a second insulation film formed on the first insulation film. Impurities are introduced into the first and second insulation films. A profile of the impurities is continuous at the interface between the first and second insulation films. The number of impurities introduced into the first insulation film is at least $2 \times 10^{13}$ atoms/cm$^2$. By the continuous impurity profile of the first and second insulation films and by setting the number of impurities introduced into the first insulation film to at least $2 \times 10^{13}$ atoms/cm$^2$, the adhesion intensity between the first and second insulation films can be improved. The second insulation film preferably includes a silicon oxide film containing at least 1% of carbon.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.
First Embodiment A fabrication process (first step–sixth step) of a semiconductor device according to a first embodiment of the present invention will be described hereinafter.

Figure 1:
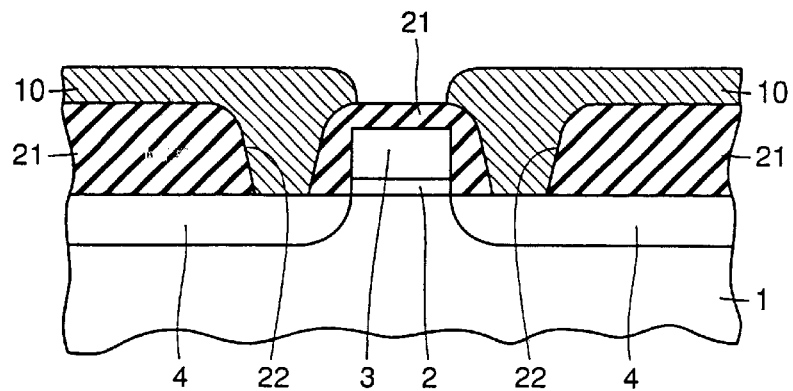
FIGS. 1–6 are sectional views of a semiconductor device for describing a fabrication process according to a first embodiment of the present invention.

At the first step shown in FIG. 1, a gate oxide film 2 is formed approximately 10 nm in thickness on a (100) p type (or n type) single crystal silicon substrate 1. A gate electrode 3 is formed approximately 200 nm in thickness on gate oxide film 2. Using gate oxide film 2 and gate electrode 3 as a mask, n type (or p type) impurities are doped into single crystal silicon substrate 1 by ion-implantation. As a result, a source.drain region 4 is formed in self-alignment. Thus, a MOS transistor is completed.

Following formation of a silicon oxide film 21 by CVD all over the device, a contact hole 22 is formed at a region of silicon oxide film 21 located above source.drain region 4.

Then, an aluminum alloy film (Al—Si(1%)—Cu(0.5%)) is deposited all over the device including the inside of contact hole 22 by sputtering. Anisotropic etching is carried out so that a desired pattern of the aluminum alloy film is obtained to form a source.drain electrode (source.drain interconnection) 10.

Figure 2:
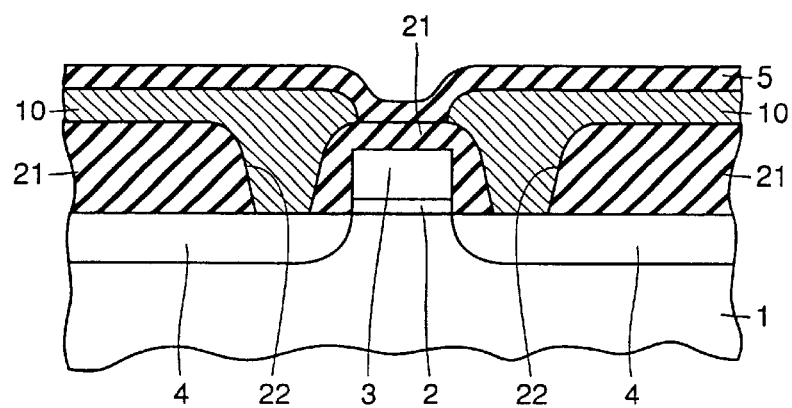

At the second step shown in FIG. 2, a silicon oxide film 5 of approximately 500 nm in thickness is formed all over the device by plasma CVD. The gas used in this plasma CVD includes monosilane and nitrous oxide (SiH$_4$+N$_2$O), monosilane and oxygen (SiH$_4$+O$_2$), TEOS (Tetra-ethoxysilane) and oxygen (TEOS+O$_2$), and the like. The temperature of film growth is 300–900° C.

Figure 3:
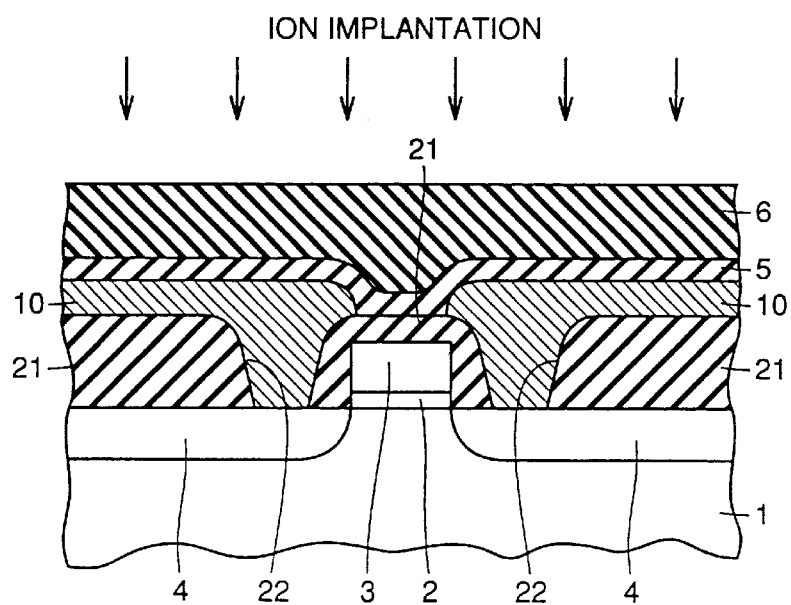

At the third step shown in FIG. 3, an organic SOG film 6 is formed on silicon oxide film 5. Organic SOG film 6 has a composition of [$CH_3Si(OH)_3$], and a film thickness of approximately 600 nm. Organic SOG film 6 is formed as set forth in the following. First, an alcohol based solution of a silicon compound of the above composition (for example, IPA+acetone) is applied on single crystal silicon substrate 1 in droplets while rotating single crystal silicon plate 1 for 20 seconds at the rotational speed of 2300 rpm. Thus, a coating of the alcohol based solution is provided on single crystal silicon substrate 1. Here, the alcohol based solution coating is formed thick at the concave portion and thin at the convex portion with respect to the step-graded portion on single crystal silicon substrate 1 to alleviate the unevenness. As a result, the surface of the alcohol based solution coating is planarized.

Then, heat treatment of 100° C. for 1 minute, 200° C. for 1 minute, 300° C. for 1 minute, 22° C. for 1 minute, and 300° C. for 30 minutes are sequentially carried out in an atmosphere of nitrogen, whereby the alcohol system is vaporized and polymerization proceeds. As a result, an organic SOG film of approximately 300 nm in thickness with a planar surface is formed. By repeating one more time this process of coating to heat treatment, an organic SOG film 6 of approximately 600 nm in thickness is obtained. This organic SOG film 6 is a silicon oxide film including at least 1% of carbon.

Then, by ion implantation, boron ions ($B^{30}$) are doped into organic SOG film 6 under the conditions of an acceleration energy of 140 OKeV and dosage of $1\times10^{15}$ atoms/$cm^2$. The condition is set so that the number of boron ions passing through the interface of inorganic SOG film 6 and silicon oxide film 5 per unit area is at least $2\times10^{13}$ atoms/$cm^2$ and not more than $2\times10^{18}$ atoms/$cm^2$.

By implanting ions into organic SOG film 6, the organic component in organic SOG film 6 is decomposed. Also, the moisture and hydroxyl group included in the film are reduced. By implanting boron ions at a level so that the ions pass the interface of organic SOG film 6 and silicon oxide film 5, the adhesion intensity between organic SOG film 6 and silicon oxide film 5 can be improved.

As a result, the organic SOG film is modified into a SOG film 7 (referred to as "modified SOG film" hereinafter) with no organic component and with little moisture or hydroxyl group, and having high adhesion with an insulation film.

Figure 4:
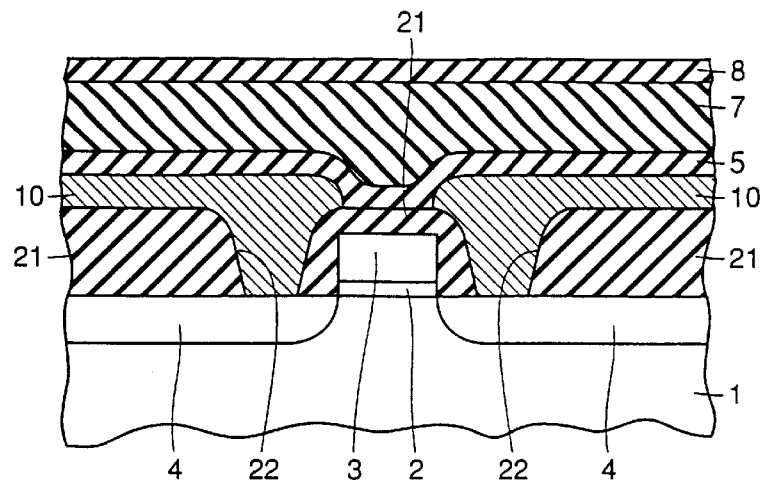

At the fourth step shown in FIG. 4, a silicon oxide film 8 of approximately 200 nm in thickness is formed on modified SOG film 7 by plasma CVD. The formation condition of silicon oxide film 8 is similar to that of silicon oxide film 5.

Figure 5:
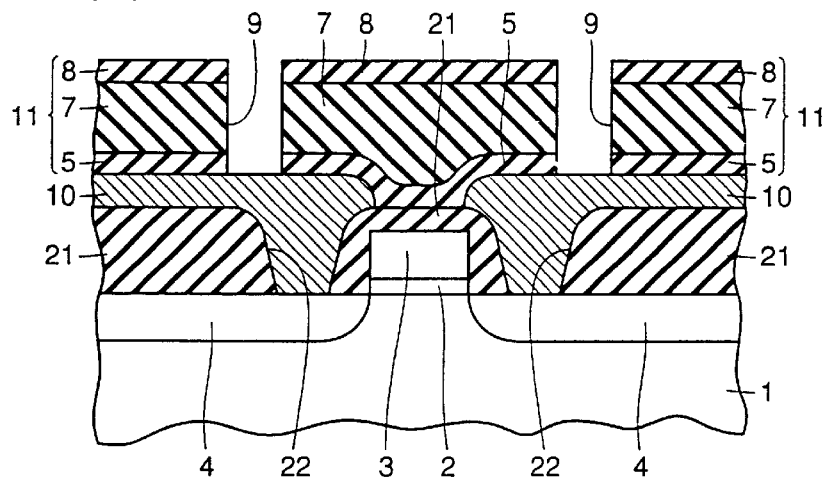

At the fifth step of FIG. 5, anisotropic etching is carried out using a mixture gas of tetra carbon fluoride ($CF_4$) and hydrogen as etching gas to form a via hole 9 in silicon oxide film 5, modified SOG film 7 and silicon oxide film 8 on source.drain region 4.

Figure 6:
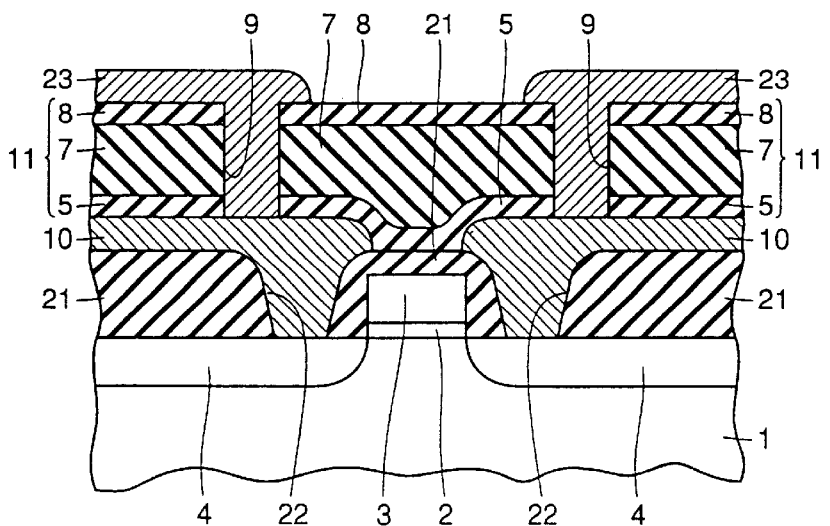

At the sixth step of FIG. 6, the interior of via hole 9 is cleaned by sputter etching using inert gas (for example, Ar). Then, magnetron sputtering is applied to sequentially form an Al alloy film (Al—Si(1%)—Cu(0.5%)) of 500 nm in film thickness, a Ti film of 50 nm in film thickness, and a TiN film of 20 nm in film thickness in this order in via hole 9 and on silicon oxide film 8.

Resist (not shown) coating, exposure, and etching processes are carried out in accordance with the general lithographic and dry etching technologies (RIE and the like) to pattern the aluminum alloy film, Ti film and TiN film to a predetermined configuration. Thus, an upper layer metal interconnection 23 is formed.

According to the first embodiment of the present invention, an interlayer insulation film 11 of a 3-layered structure of silicon oxide film 5, modified SOG film 7 and silicon oxide film 8 is formed on a MOS transistor. The presence of modified SOG film 7 allows a thicker interlayer insulation film 11 to be formed. As a result, sufficient planarization can be achieved even for a great step-graded portion on single crystal silicon substrate 1.

A sandwich structure of modified SOG film 7 between silicon oxide films 5 and 8 is employed for the purpose of further improving the insulation and mechanical strength characteristics for the entire interlayer insulation film 11.

According to the first embodiment of the present invention, modified SOG film 7 does not easily peel away from silicon oxide film 5 since organic SOG film 6 is subjected to ion implantation so that impurities of at least a predetermined integrated intensity (number per unit area) passes through the interface between silicon oxide film 5 and organic SOG film 5 as described above.

Table 1 shows the verified results using a tensile tester of the adhesion intensity between SOG film 6 and silicon oxide film 5 in a test device (1) having an SOG film of 600 nm in film thickness formed on silicon oxide film 5.

TABLE 1

| Condition | Film Peel Off Rate |
| --- | --- |
| Organic SOG Film | 100% |
| Low-pressure oxygen Plasma Process | 100% |
| Modified SOG Film (Ar ion Implantation) | 0% |
| Modified SOG Film (B ion Implantation) | 0% |

The condition column in Table 1 corresponds to those used as an SOG film. The low-pressure oxygen plasma process implies that an organic SOG film is exposed to oxygen plasma. The modified SOG film is formed under the conditions identical to those of the present embodiment.

By employing a modified SOG film as the SOG film, the adhesion with the underlying silicon oxide film 5 is improved to prevent the film from peeling off.

Figure 7:
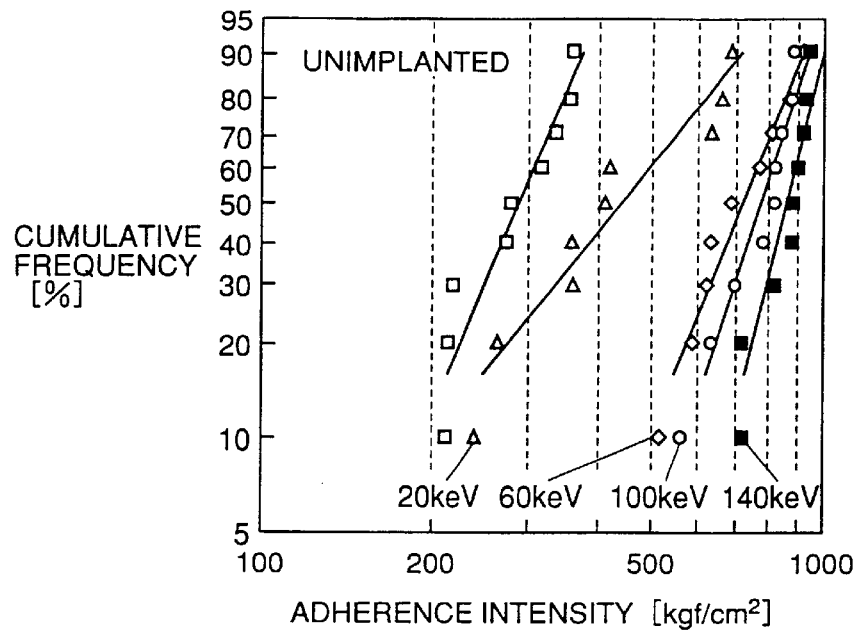
FIGS. 7–21 are diagrams of characteristics for describing an embodiment of the present invention.

FIG. 7 shows the adhesion intensity when boron ions ($B^+$) are implanted under different conditions to the SOG in the test device (1) similar to that of the above Table 1. The dosage was set to a constant value of $1\times10^{15}$ atoms/$cm^2$, and the acceleration energy was varied to 20, 60, 100, and 140 KeV. The label "UNIMPLANTED" in the drawing implies that the film is not subjected to ion implantation, i.e. an organic SOG film.

It is appreciated that a film not subjected to ion implantation exhibits poor adhesion between the SOG film and silicon oxide film 5. The film will easily peel off. In contrast, those subjected to ion implantation exhibit higher adhesion intensity as the acceleration energy becomes greater. Particularly with an acceleration energy of at least 60 KeV, an adhesion intensity greater than 70 $Kgf/cm^2$ can be achieved. This improvement in adhesion intensity is considered to be caused by ions arriving at the interface between the SOG film and silicon oxide film 5 to promote mixing and recombination of the element at the interface.

Figure 8:
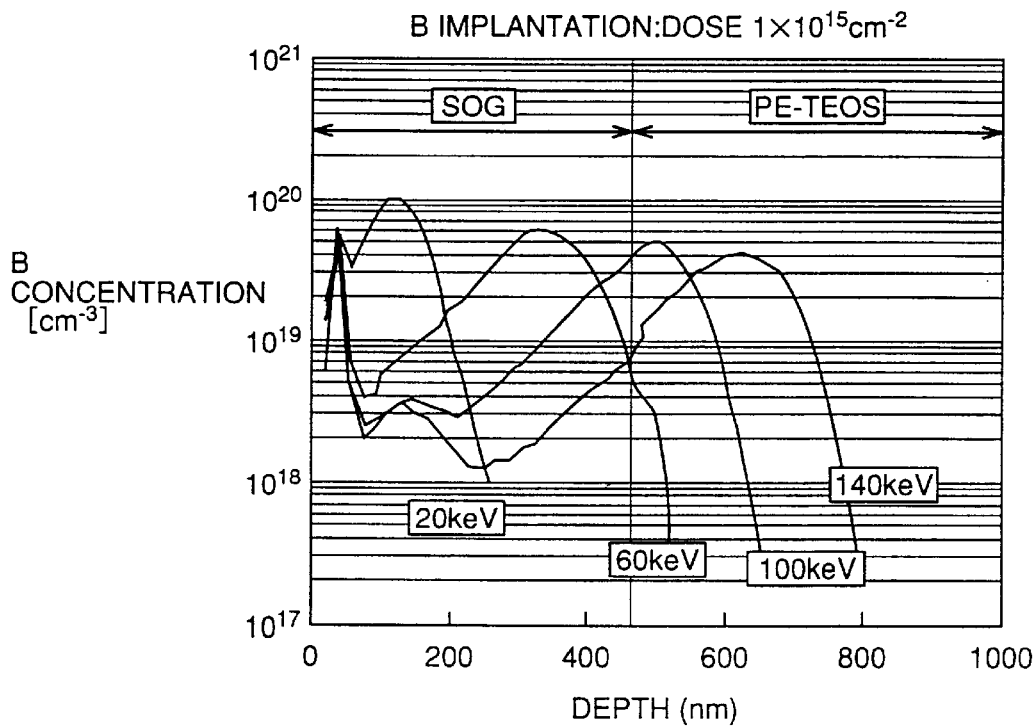
Figure 9:
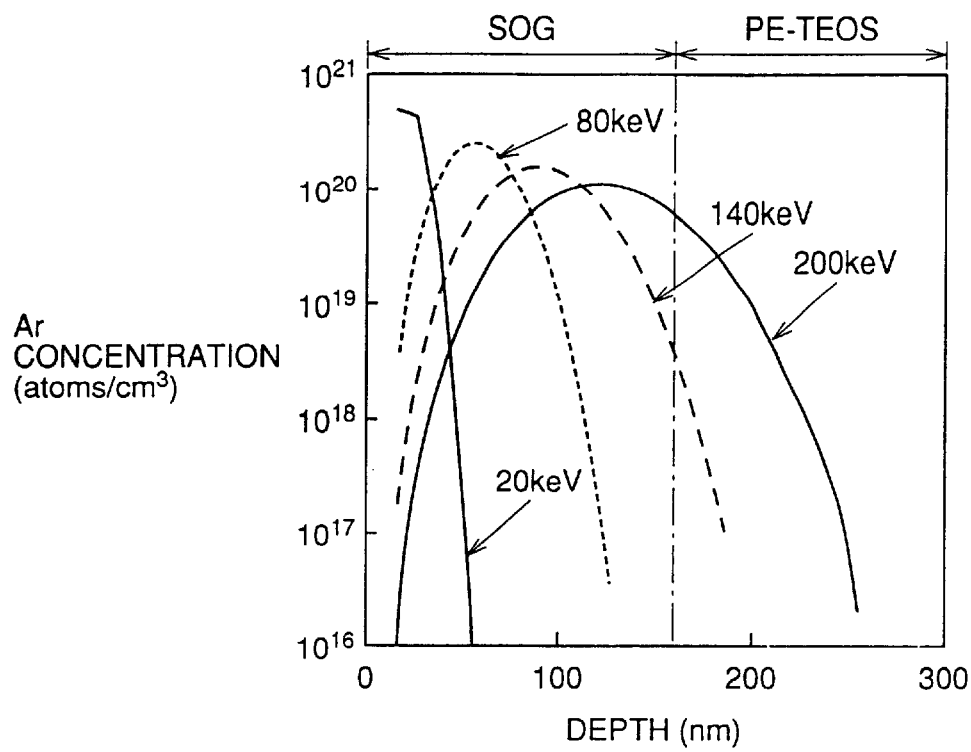

FIG. 8 shows the impurity profile of boron (B) in the SOG film and the underlying plasma TEOS oxide film 5. It is appreciated from FIG. 8 that the impurity concentration distribution of boron in the SOG film and that in the plasma TEOS oxide film are continuous. This is because impurities are ion-implanted into the SOG film so that the boron ions pass through the interface of the SOG film and the underlying plasma TEOS oxide film 5. Similarly, when Ar ions are implanted, an impurity profile is formed continuously at the interface between the SOG film and the underlying plasma TEOS oxide film as shown in FIG. 9.

Figure 10:
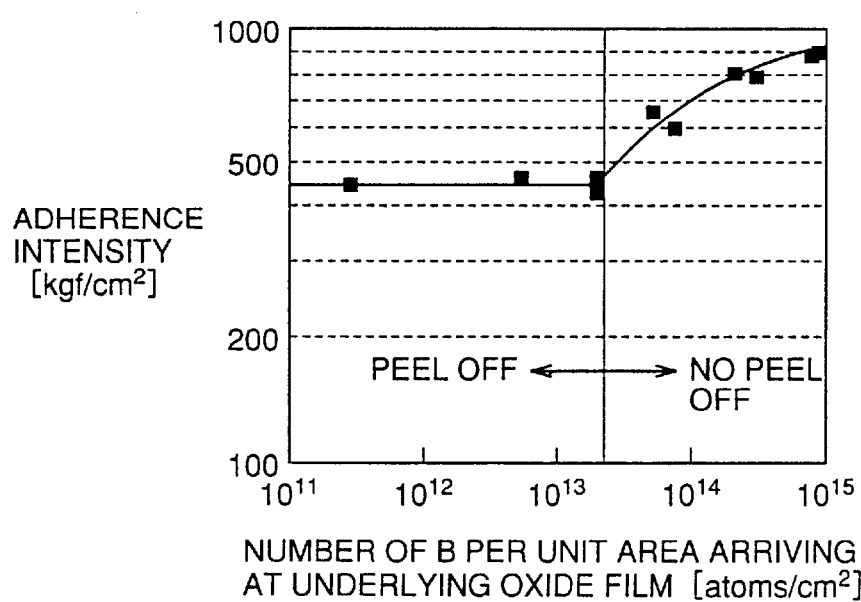

FIG. 10 shows the measured result of the relationship between the number of boron ions passing through the interface of the SOG film and silicon oxide film 5 per unit area and the adhesion intensity. It is appreciated from FIG. 10 that the adhesion between the SOG film and silicon oxide film 5 is suddenly increased to extremely reduce the generation rate of film peel off when the number of boron ions passing through the interface per unit area exceeds $2 \times 10^{13}$ atoms/cm$^2$. It is therefore preferable to set the number of boron ions passing through the SOG film and the silicon oxide film per unit area to at least $2 \times 10^{13}$ atoms/cm$^2$ for the purpose of effectively preventing the SOG film from peeling off silicon oxide film 5. When the number of boron ions passing through the interface per unit area exceeds $2 \times 10^{18}$ atoms/cm$^2$, the sputtering effect becomes so great that the surface is removed. It is therefore preferable to set the number of boron ions passing through the interface per unit area to less than $2 \times 10^{18}$ atoms/cm$^2$.

In order to set the number of boron ions passing through the interface per unit area greater than $2 \times 10^{13}$ atoms/cm$^2$ in the above test device (1), an acceleration energy of at least 60 KeV with a dosage of $1 \times 10^{15}$ atoms/cm$^2$ is required.

Figure 11:
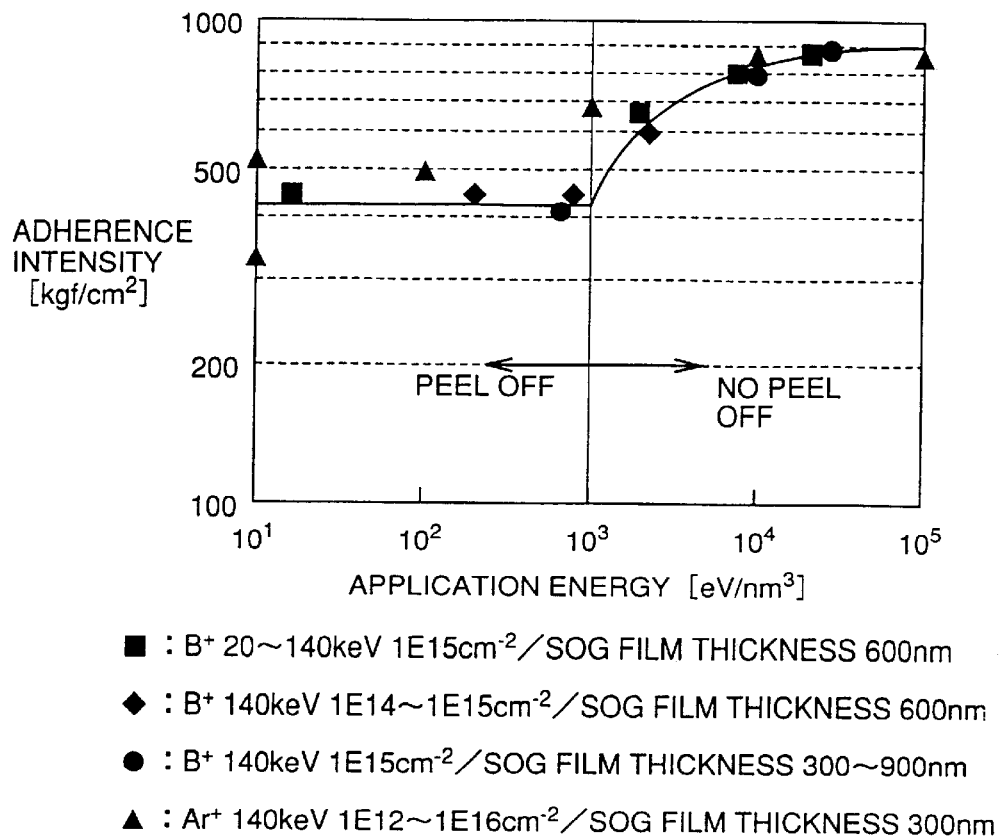

FIG. 11 shows the relationship between the application energy and adhesion with different values of the boron implantation energy, boron dosage, SOG film thickness at boron-implantation, and argon dosage. Here, "application energy" refers to the energy per unit volume applied to a region of the implanted depth of the ions. It is appreciated from FIG. 11 that the adhesion between the SOG film and silicon oxide film 5 is suddenly increased to result in an extremely low generation rate of the film peel off when the application energy becomes greater than $10^3$ eV/nm$^3$. It is therefore preferable to set the application energy to at least $10^3$ eV/nm$^3$ in order to effectively prevent the SOG film from peeling off silicon oxide film 5. It is also appreciated that the adhesion intensity can be improved even when argon (Ar) is implanted instead of boron (B) as shown in FIG. 11.

The following Table 2 shows the evaluated result using a tensile strength tester of the adhesion intensity between a silicon oxide film 8 and a SOG film in a test device (2) having silicon oxide film 8 formed on an SOG film of 600 nm in film thickness.

TABLE 2

| Condition | Film Peel Off Rate |
| --- | --- |
| Organic SOG Film | 60% |
| Low-pressure oxygen Plasma Process | 0% |
| Modified SOG Film (Ar ion Implantation) | 0% |
| Modified SOG Film (B ion Implantation) | 0% |

The above condition column refers to those used as an SOG film. Low-pressure oxygen plasma process refers to an organic SOG film exposed to oxygen plasma. Ion-implantation was carried out before formation of silicon oxide film 8.

It is appreciated from Table 2 that when a modified SOG film is used as an SOG film, the adhesion between the upper silicon oxide film 8 and the modified SOG film is increased to prevent film peel off.

Figure 12:
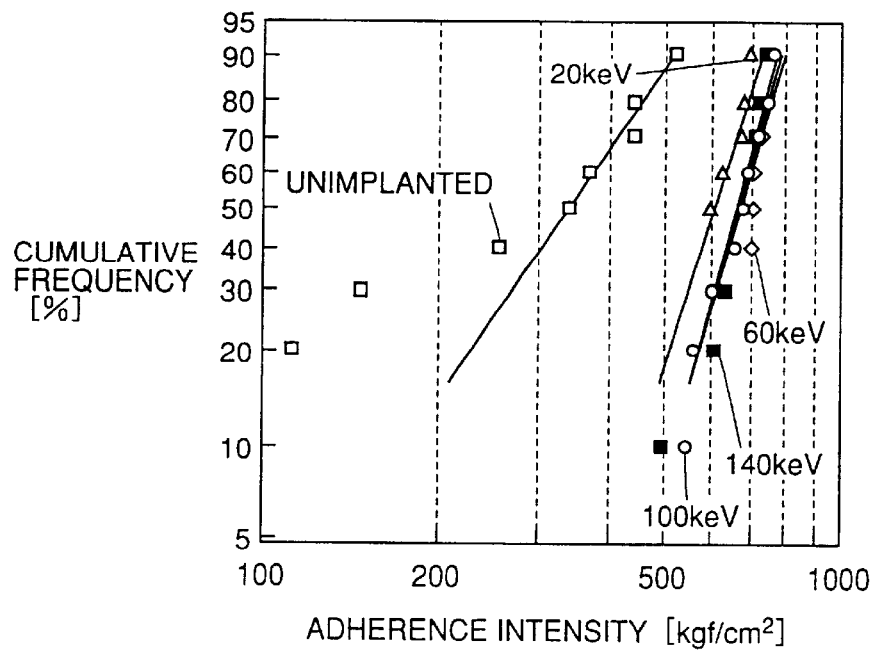

FIG. 12 shows the results of experiments similar to those of FIG. 7 carried out using the above test device (2). It is appreciated from FIG. 12 that the film not subjected to ion implantation has a low adhesion intensity of 200–500 Kgf/cm$^2$. The film will easily peel off at the interface. In contrast, a film subjected to ion implantation exhibits a high adhesion intensity of at least 700 Kgf/cm$^2$ which is the measurement limit irrespective of the acceleration energy. This improvement in adhesion is considered to be caused by the organic component of the entire or the surface of the SOG film being decomposed to become inorganic, whereby the adhesion between the inorganic portion of the SOG film and silicon oxide film 8 which is inorganic has become stronger.

It is to be noted that in the present embodiment, ions are implanted into organic SOG film 6 before, not after, deposition of silicon oxide film 8, to form modified SOG film 7. In general, a silicon oxide film formed by plasma CVD per se is less hygroscopic than an organic SOG film and is also superior in water resistance. This level of hygroscopicity becomes slightly higher by the ion-implantation step to the silicon oxide film. However, the level thereof is significantly lower than that of an organic SOG film. This slightly higher level of the hygroscopicity of silicon oxide film 5 located beneath modified SOG film 7 will induce no great problem owing to the presence of modified SOG film 7 located above with low hygroscopicity and superior water resistance. However, the hygroscopicity of silicon oxide film 8 is preferably as low as possible since the moisture of silicon oxide film 8 located above modified SOG film 7 may adversely affect metal interconnection 23 located above. In the present embodiment, increase in hygroscopicity of silicon oxide film 8 is prevented by forming silicon oxide film 8 after implanting ions into organic SOG film 6.

Furthermore, since modified SOG film 7 includes no organic component, the etching process to form via hole 9 can be carried out in an atmosphere of a mixture gas of tetra carbon fluoride and hydrogen. Therefore, the photoresist, if used as a etching mask in this etching process, will not be invaded by the etching gas. Therefore, modified SOG film 7 masked by the photoresist will not be etched. Thus, via hole 9 of a submicron configuration can be formed accurately.

Since modified SOG film 7 includes no organic component, the etching rate of modified SOG film 7 is equal to that of the underlying silicon oxide film 5 and upper silicon oxide film 8. Also, modified SOG film 7 will not become hygroscopic during the ashing process in removing the photoresist employed as an etching mask.

No cracks will be generated in modified SOG film 7. Furthermore, a recess will not be generated during formation of via hole 9. It is therefore possible to fill via hole 9 with upper metal interconnection 23 sufficiently.

Figure 13:
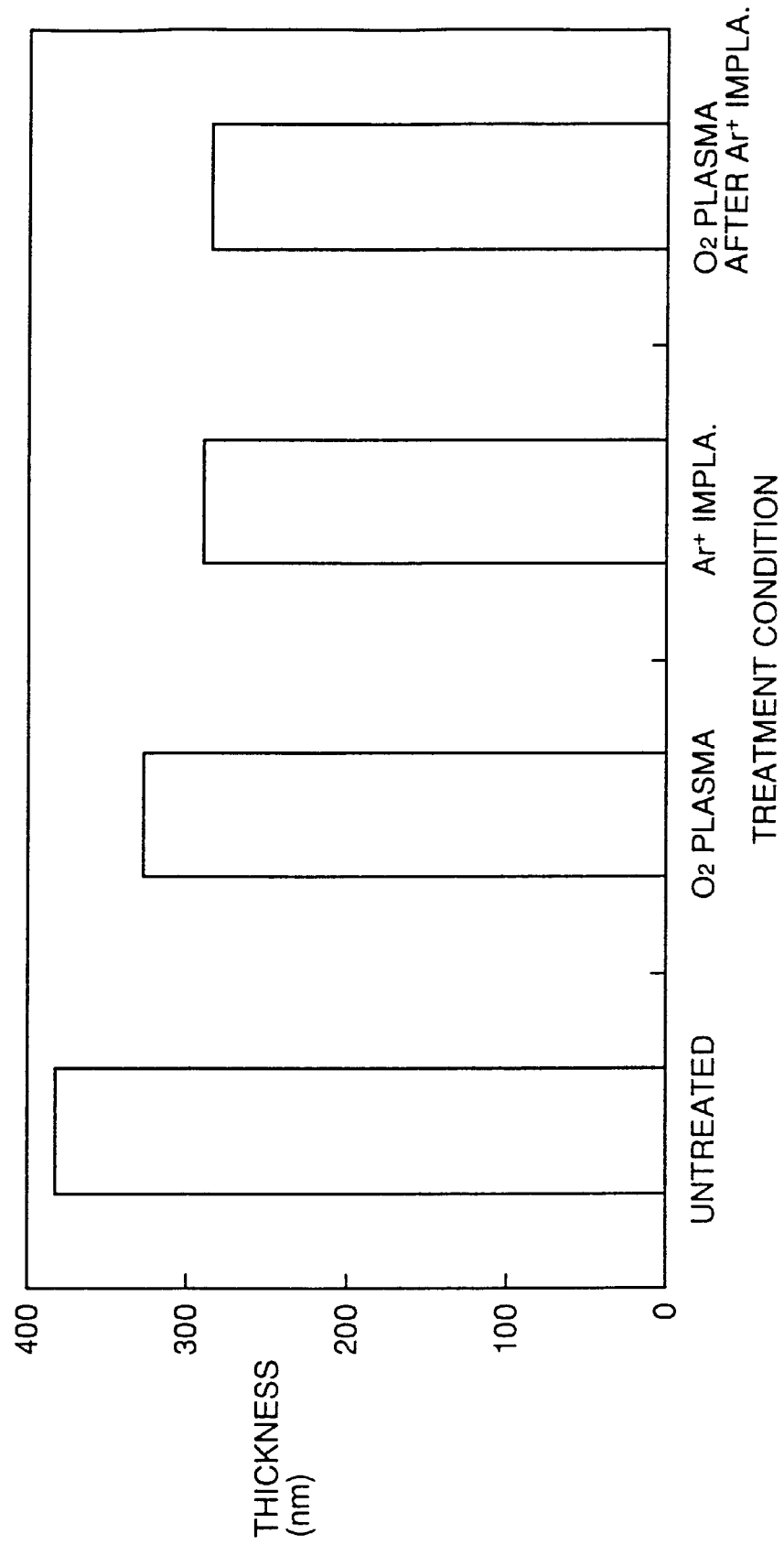

Modified SOG film 7 is also superior in oxygen plasma resistance. FIG. 13 shows, as an index of oxygen plasma resistance, change in the film thickness when modified SOG film 7 formed by implanting argon ions into organic SOG film 6 is exposed to oxygen plasma for the evaluation of reduction in the film thickness of modified SOG film 7. Ions were implanted under the conditions of an acceleration energy of 140 KeV and a dosage of $1 \times 10^{15}$ atoms/cm$^2$.

When organic SOG film 6 is subjected to oxygen plasma (O$_2$ PLASMA), the film thickness was reduced 16% than the initial film thickness of organic SOG film 6 (UNTREATED). When the modified SOG film is subjected to oxygen plasma (O$_2$ PLASMA AFTER Ar$^+$ IMPLA.), there was almost no reduction in the film thickness compared to that of the initial modified SOG film 7 (Ar$^+$ IMPLA.). However, the film thickness of modified SOG film 7 is reduced 25% in comparison to that of organic SOG film 6.

From the above results, it is appreciated that modified SOG film 7 is superior in oxygen plasma resistance. Furthermore, since reduction in the film thickness is greater when ions are implanted than the case where the film is exposed to oxygen plasma, it is considered that the film density is greater when ions are implanted.

The superior oxygen plasma resistance characteristic of modified SOG film 7 allows oxygen-based gas to be included as an etching gas to form via hole 9. This means that the range of selection of the types of etching gases can be increased. Also, oxygen-based gas of high ashing efficiency can be used in ashing the photoresist employed as an etching mask.

Figure 14:
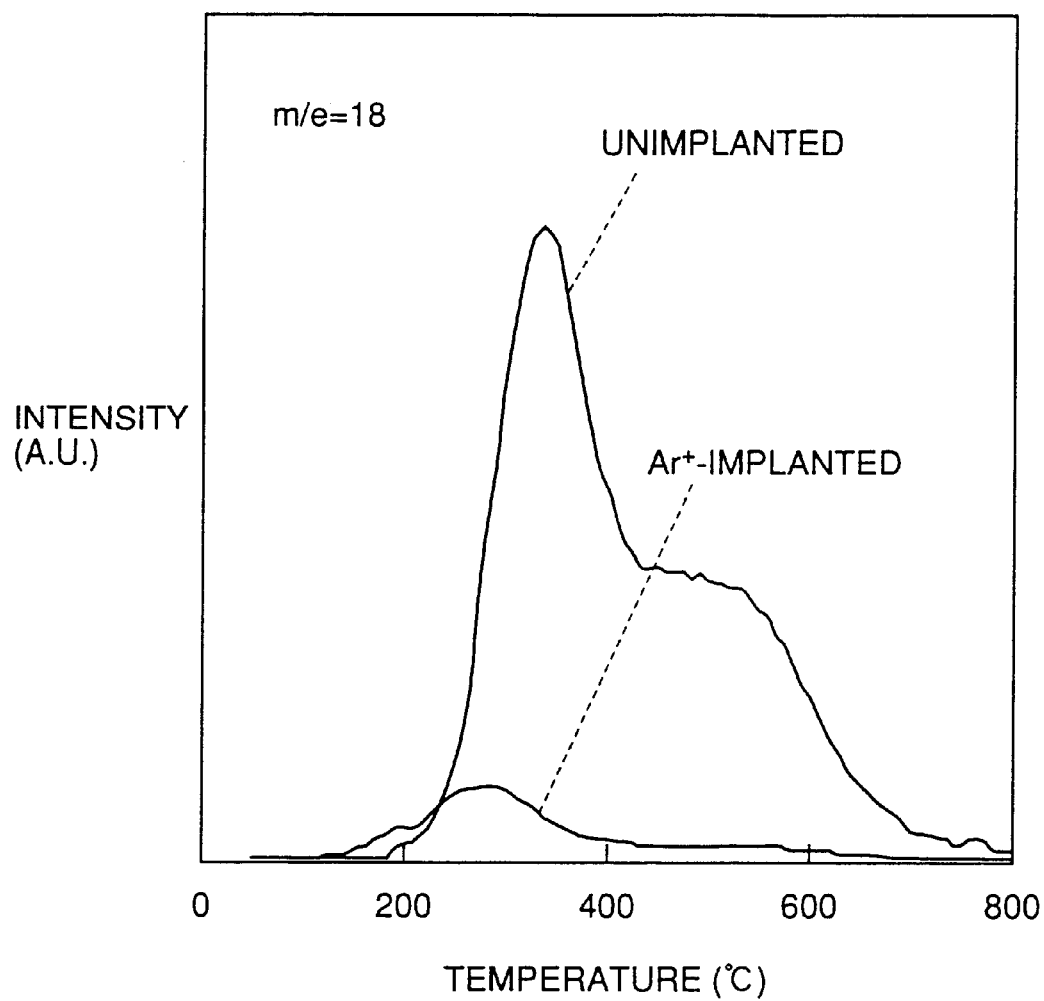

FIG. 14 shows the evaluation result of an organic SOG film (untreated: UNIMPLANTED) and a modified SOG film 7 (ion implanted: $Ar^+$-IMPLANTED) subjected to heat treatment for 30 minutes in an atmosphere of nitrogen by TDS (Thermal Desorption Spectroscopy). Ions were implanted under the condition of an acceleration energy of 140 KeV and a dosage of $1 \times 10^{15}$ atoms/cm$^2$.

FIG. 14 represents the amount of desorption of $H_2O$ (m/e=18). It is appreciated from FIG. 14 that the desorption of $H_2O$ (m/e=18) for modified SOG film 7 is small. This means that, by implanting ions into organic SOG film 6 to obtain modified SOG film 7, the moisture and hydroxyl group included in organic SOG film 6 are reduced.

Figure 15:
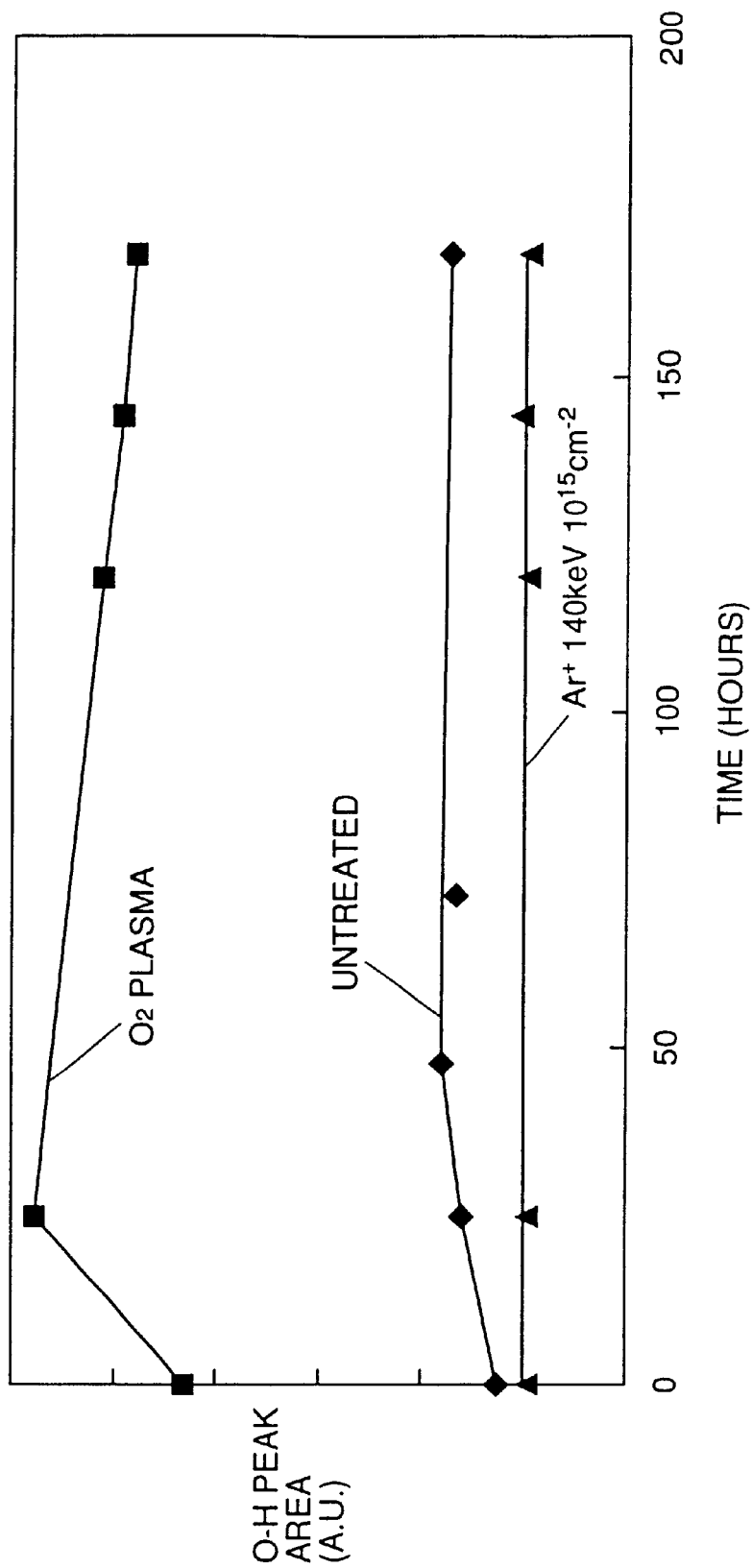

FIG. 15 shows the evaluation result of the moisture in the films of organic SOG film 6 (UNTREATED), an organic SOG film 6 subjected to oxygen plasma ($O_2$ PLASMA), and modified SOG film 7 ($Ar^+$) left in the atmosphere in a clean room with respect to hygroscopicity of organic SOG film 6 and modified SOG film 7. The amount of moisture in each film was indicated by the integrated intensity of the O—H group in the infrared absorption spectrum (in the vicinity of 3500 cm$^{-1}$) using the FT-IR method (Fourier Transform Infrared Spectroscopy). Ion implantation was carried out under the conditions of an acceleration energy of 140 KeV and a dosage of $1 \times 10^{15}$ atoms/cm$^2$.

It is appreciated that the moisture increases, not only before and after the treatment, but also even after 1 day when organic SOG film 6 is exposed to oxygen plasma. In contrast, modified SOG film 7 shows no increase in moisture after the ion implantation. Furthermore, the increase in moisture is smaller than that of organic SOG film 6 even when left in the atmosphere of a clean room. This means that modified SOG film 7 is less hygroscopic than organic film 6.

Figure 16:
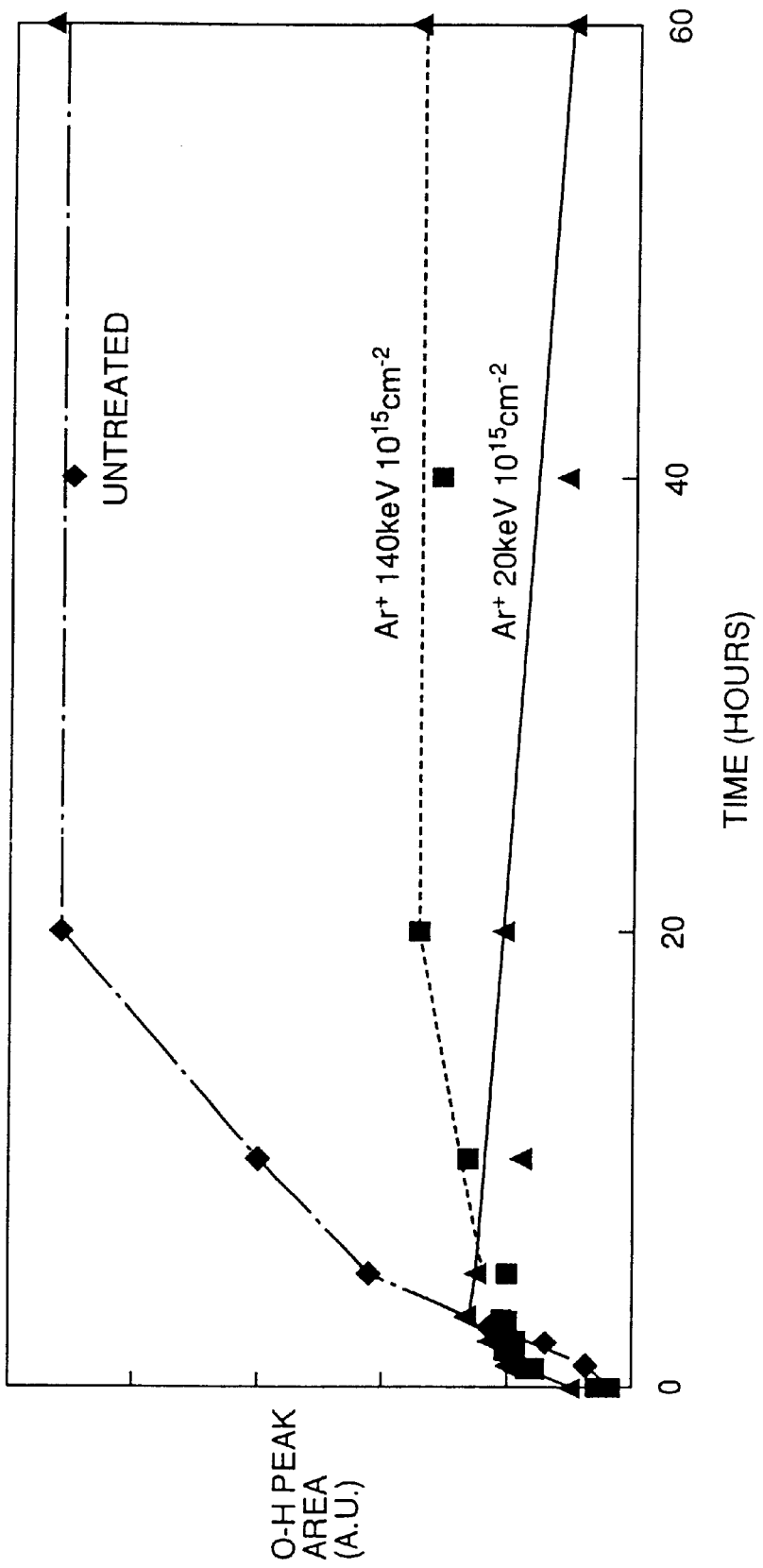

FIG. 16 shows the results of a pressure cooker test (PCT) carried out for the purpose of evaluating the moisture permeability of modified SOG film 7 and organic SOG film 6. This PCT is a humidification test carried out in a saturated moisture ambient at 2 atmospheric pressure and 120° C. in the present embodiment. The integrated intensity of the absorption peak (in the vicinity of 3500 cm$^{-1}$) of the O-H in organic SOG film 6 was obtained and plotted over the PCT time using the FT-IR method.

A specimen ($Ar^+$ 20 KeV) having only the surface modified by ion implantation was prepared and compared with a specimen having the film entirely modified ($Ar^+$ 140 KeV) and with a specimen that was not modified (organic SOG film 6: UNTREATED). When organic SOG film 6 not modified is subjected to the PCT, the absorption intensity (of the O—H group) in the vicinity of 3500 cm$^{-1}$ shows a significant increase. In modified SOG film 7, the increase of the absorption intensity in the vicinity of 3500 cm$^{-1}$ (of the O—H group) is small. The increase in the specimen in which only the film surface is modified is substantially equal to that of the film that is completely modified.

It is understood from the above results that a layer that has moisture permeability suppressed can be formed by implanting ions.

FIGS. 17–21 show the results of various experiments carried out using a test device (3) in which an interlayer insulation film of silicon oxide film 8/organic SOG film 6 (modified SOG film 7)/silicon oxide film 5 is formed on an NMOS transistor as shown in FIGS. 1–4. In this test device (3), modified SOG film 7 is formed by implanting argon ions into organic SOG film 6. A similar advantage can be obtained by implanting argon ions as in the case of implanting boron ions. The contents of each of the various experiments will be described hereinafter.

Figure 17:
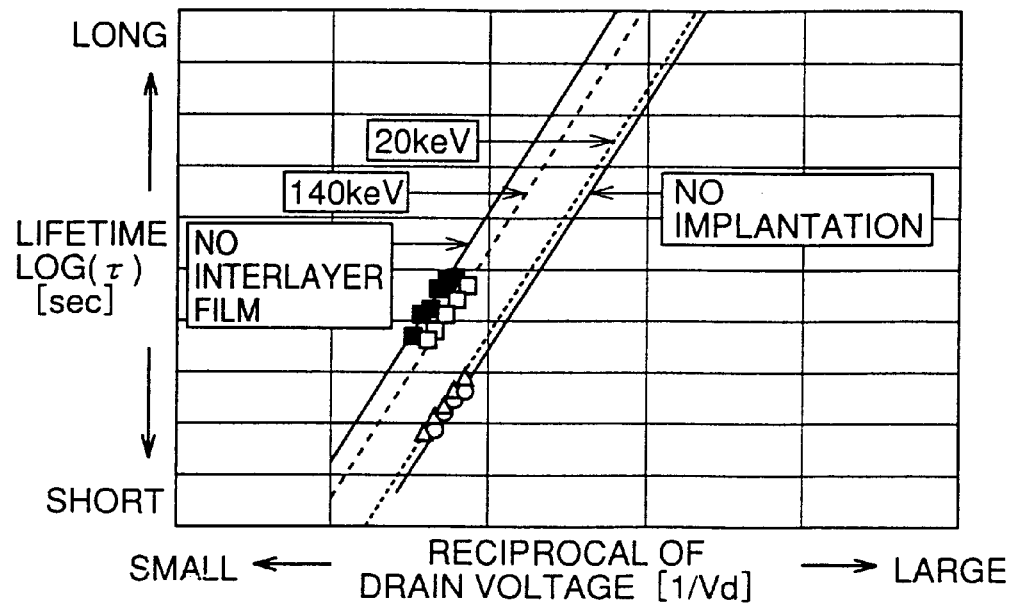

FIG. 17 shows the dependency of the hot carrier lifetime of an NMOS transistor on drain voltage. Here, hot carrier lifetime refers to the period of time before the Gm (transconductance) is degraded to a predetermined rate. It is a parameter indicating the lifetime of a transistor. It is appreciated from FIG. 17 that the device employing modified SOG film 7 (particularly with the acceleration energy of 140 KeV) has the hot carrier lifetime increased by approximately 2 orders of magnitude than that employing an organic SOG film that is not subjected to ion implantation.

Figure 18:
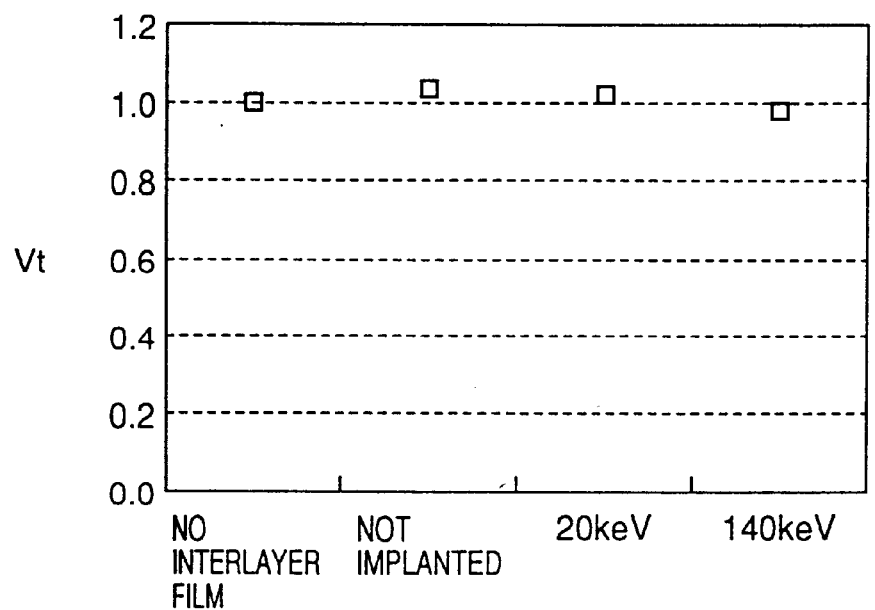
Figure 19:
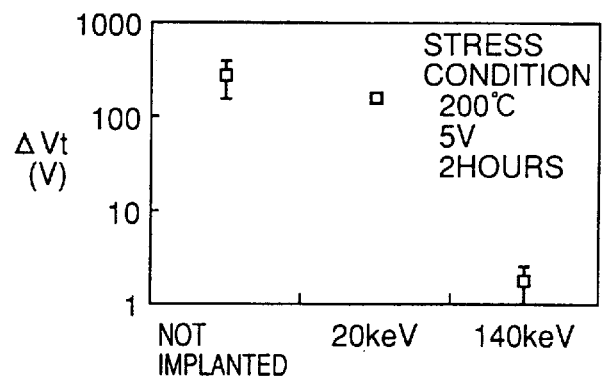

FIGS. 18 and 19 show the threshold voltage Vt before and after an acceleration test (applying a voltage of 5 V for 2 hours to the transistor of test device (3) under the temperature condition of 200° C.). FIG. 18 indicates the threshold voltage Vt before the acceleration test, and FIG. 19 indicates threshold voltage Vt after the acceleration test.

It is appreciated from FIG. 18 that, before the acceleration test, there is almost no change in the threshold voltage for both the device employing an organic SOG film not subjected to ion implantation and the device employing modified SOG film 7.

In FIG. 19, the threshold voltage Vt of the device employing an organic SOG film not subjected to ion implantation showed a significant change, whereas the device employing modified SOG film 7 (particularly, the device with the acceleration energy of 140 KeV) showed almost no change regardless of the gate length. This means that, in a device employing modified SOG film 7, the threshold value characteristics of a MOS transistor is stable over a long period of time.

Figure 20:
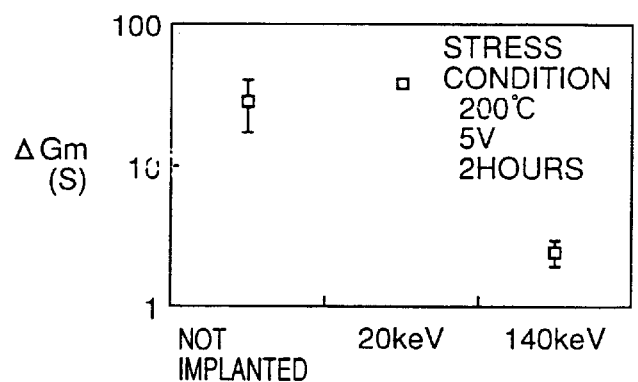

FIG. 20 shows the change in the Gm value of the transistor before and after an acceleration test similar to that of FIG. 19. Referring to FIG. 20, the device employing an organic SOG film not subjected to ion implantation exhibited a great change in Gm before and after the test, whereas the device employing modified SOG film 7 (particularly, the device with the acceleration energy of 140 KeV) exhibited almost no change in Gm regardless of the gate length. This result implies that the Gm of the MOS transistor is stable for over a long period of time.

Figure 21:
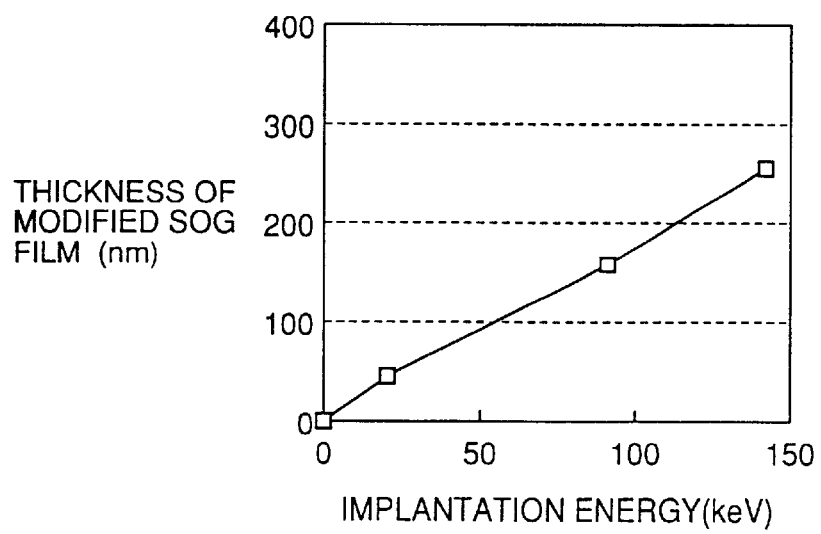

The results of FIGS. 17–20 indicate that the improvement effect is small for the device including modified SOG film 7 formed under the acceleration energy of 20 KeV in comparison to that formed with an acceleration energy of 140 KeV. This is probably because of the fact that the acceleration energy (implantation energy) takes a positive correlative relationship with the depth of the modified portion of organic SOG film 7 as shown in FIG. 21. When the acceleration energy is 20 keV, only the surface layer (approximately 50 nm) of organic SOG film 6 is modified.

In the first embodiment of the present invention, impurities are implanted into organic SOG film 6 to convert only the portion of organic SOG film 6 implanted with ions into modified SOG film 7. Therefore, the amount of moisture and hydroxyl group included in the film can be reduced. Also, the film becomes less hygroscopic. Furthermore, the adhesion intensity between modified SOG film 7 and silicon oxide films 5 and 8 can be increased. As a result, an interlayer insulation film of high reliability can be obtained.
Second Embodiment The second embodiment differs from the first embodiment only in the structure of the source.drain electrode (source.drain interconnection). In the second embodiment, only the relevant elements will be described.

The source.drain electrode of the second embodiment includes a TiN/Ti layered film beneath an aluminum alloy film as the so-called barrier metal, and a TiN/Ti layered film above the aluminum alloy film as an anti-reflection film (cap metal).

Figure 22:
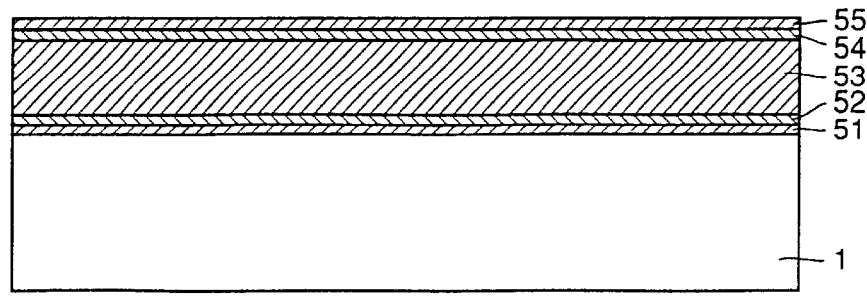
FIGS. 22–24 are sectional views of a semiconductor device for describing a fabrication process according to a second embodiment of the present invention.

A specific fabrication process will be described hereinafter. At a first step corresponding to the fabrication process of the first embodiment shown in FIG. 1, a Ti film 51 (film thickness 50 nm), a TiN film 52 (film thickness 100 nm), an aluminum alloy film (Al—Si(1%)—Cu(0.5%)) 53 (film thickness 600 nm), a Ti film 54 (film thickness 20 nm), and a TiN film 55 (film thickness 100 nm) are sequentially formed in this order by magnetron sputtering as shown in FIG. 22 for the purpose of forming a source.drain electrode.

Figure 23:
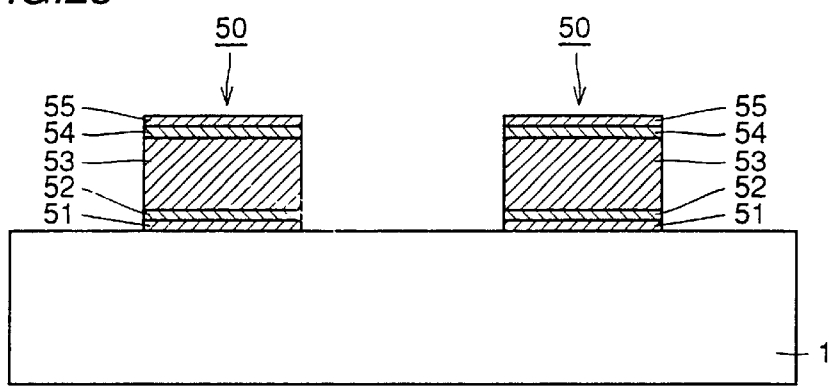

Referring to FIG. 23, these layered films are subjected to anisotropic etching to obtain a desired pattern. Thus, a source.drain electrode 5 is formed. It is to be noted that in FIGS. 22 and 23, gate oxide film 2, gate electrode 3, source.drain region 4, silicon oxide film 21 and contact hole 22 as shown in FIG. 1 are omitted in FIGS. 22 and 23.

Figure 24:
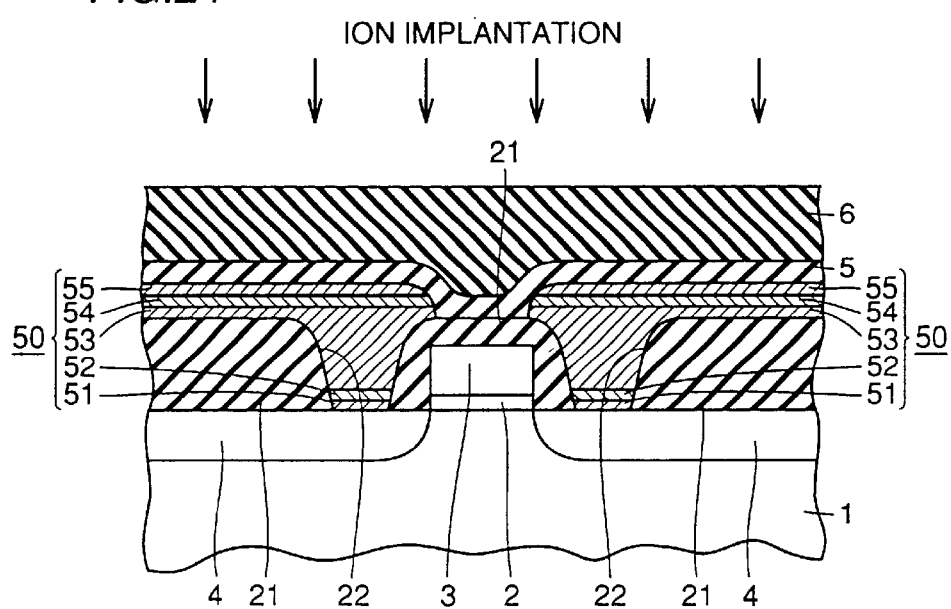

The fabrication process shown in FIG. 24 follows the fabrication step of FIG. 23. Similar to the third step of the first embodiment, following the formation of silicon oxide film 5 and organic SOG film 6, boron ions are implanted into organic SOG film 5 under the conditions of an acceleration energy of 140 KeV and a dosage of $1\times10^{15}$ atoms/cm$^2$.

By carrying out ion implantations under such conditions, boron ions arrive, not only at silicon oxide film 5, but also at Ti film 54. Since boron ions are introduced to Ti film 54, a TiB$_2$ compound phase is formed within Ti film 54, whereby the interconnection resistance is reduced.

The following Table 3 shows the resistivity of various Ti based metals. It is appreciated from Table 3 that TiB$_2$ has a resistivity extremely lower than that of the other metals.

TABLE 3

|  | TiB$_2$ | Ti | TiN | TiC |
|---|---|---|---|---|
| Resistivity ($\mu\Omega \cdot$ cm) | 25 | 70 | 100 | 150 |

According to the second embodiment of the present invention, the interconnection resistance can be reduced by introducing impurities (boron: B) into Ti film 54 in addition to the advantage of the first embodiment. Therefore, the thickness of Ti film 54 itself can be made thinner. This means that the entire source.drain electrode 50 can be reduced in thickness. In this case, the characteristics of the contact resistance and electromigration resistance are equal to those of a Ti film not introduced with ions.

Thus, microfabrication and the integration density of a semiconductor device can be improved. Also, the present invention contributes to speeding the element operation since the parasitic capacitance between the interconnections can be reduced by virtue of a thinner interconnection layer.

Data supporting the advantage of the above first and second embodiments are shown in FIGS. 25–29.

Figure 25:
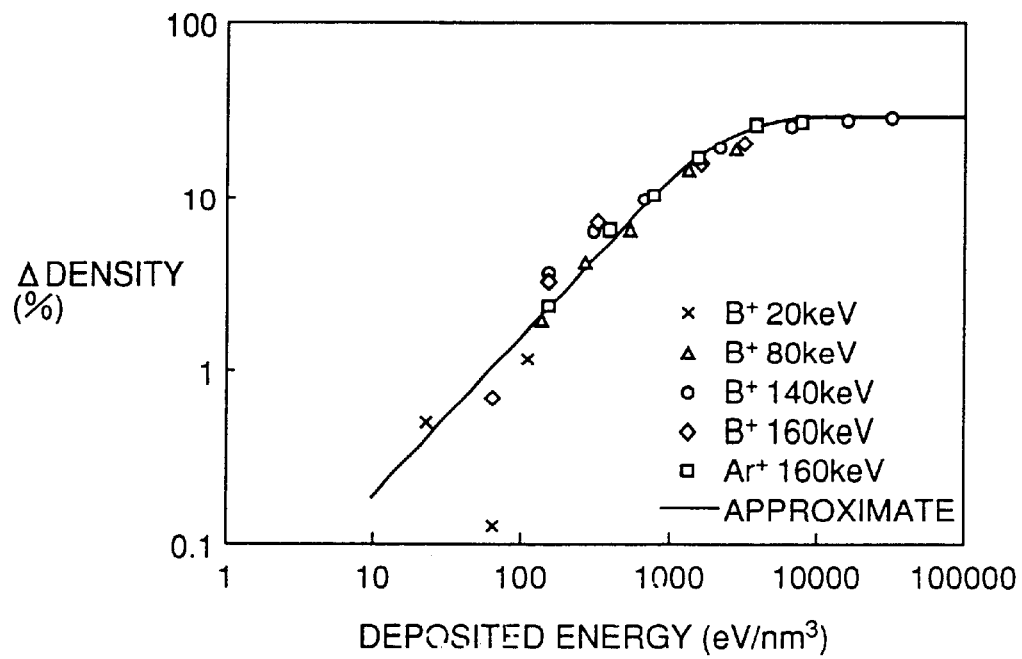
FIGS. 25–29 are diagrams of characteristics for describing an embodiment of the present invention.

FIG. 25 shows the relationship between the increasing rate of density ($\Delta$ DENSITY) of a film when ions (B or Ar) are implanted into an organic SOG film and the total deposited energy by ion-implantation (DEPOSITED ENERGY (FOR IONIZATION)). It is appreciated from FIG. 25 that the increasing rate of the density of the film increases in proportion to increase of the total deposited energy. Saturation is achieved when the total deposited energy exceeds $1\times10^4$ eV/nm$^3$. This relationship does not substantially change even when the acceleration energy or type of ion differs.

Figure 26:
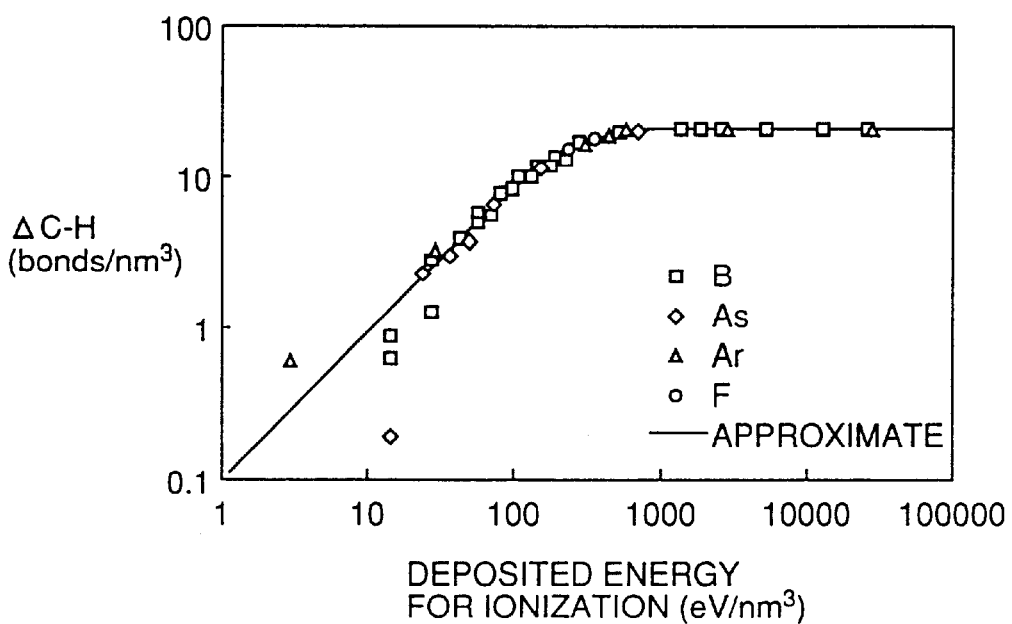

FIG. 26 shows the relationship between the amount of decomposition of the C—H group ($\Delta$C—H) in the film when various ions (B, As, Ar or F) are implanted into an organic SOG film and the ionization (related to electronic stopping power) of the total deposited energy by ion implantation (DEPOSITED ENERGY FOR IONIZATION). It is appreciated from FIG. 26 that the amount of decomposition of the C—H group increases in proportion to the increase of the deposited energy. Saturation is achieved when the deposited energy exceeds $1\times10^3$ eV/nm$^3$. This relationship shows almost no change even when the type of ions differ.

Figure 27:
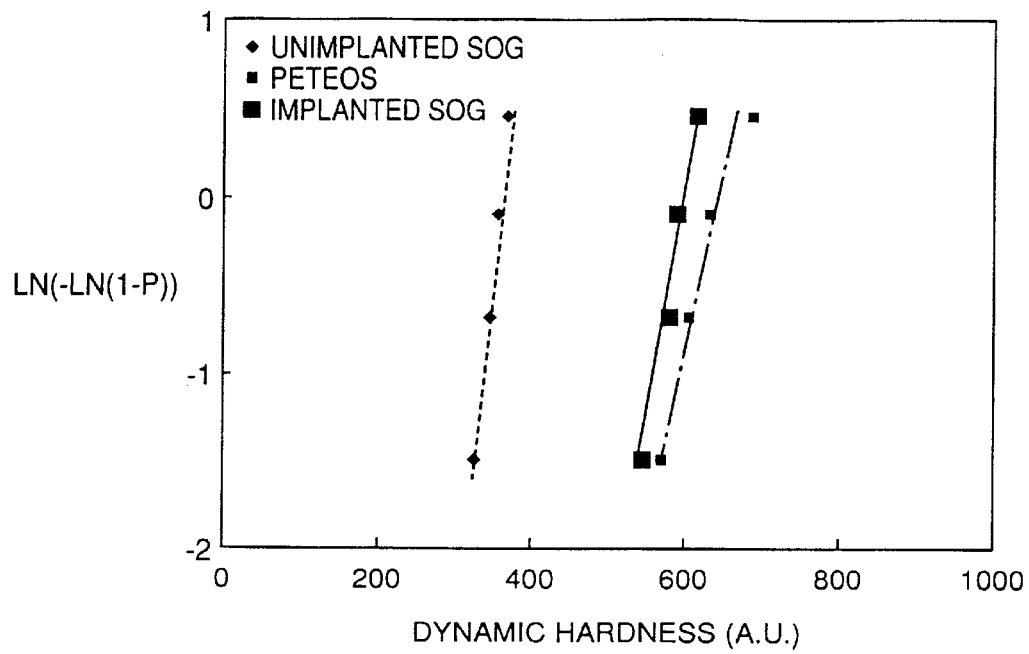

FIG. 27 shows the relationship between the LN (—LN (1-P)) and the hardness of the film (DYNAMIC HARDNESS) of the cumulative frequency of the measurement points when boron ions are implanted into the organic SOG film. Referring to FIG. 27, the film implanted with ions (IMPLANTED SOG: solid line in drawing) has a hardness substantially equal to that of a silicon oxide film formed by plasma CVD (PETEOS: chain dotted line in drawing) in comparison to a film not subjected to ion implantation (UNIMPLANTED SOG: dotted line in drawing).

Figure 28:
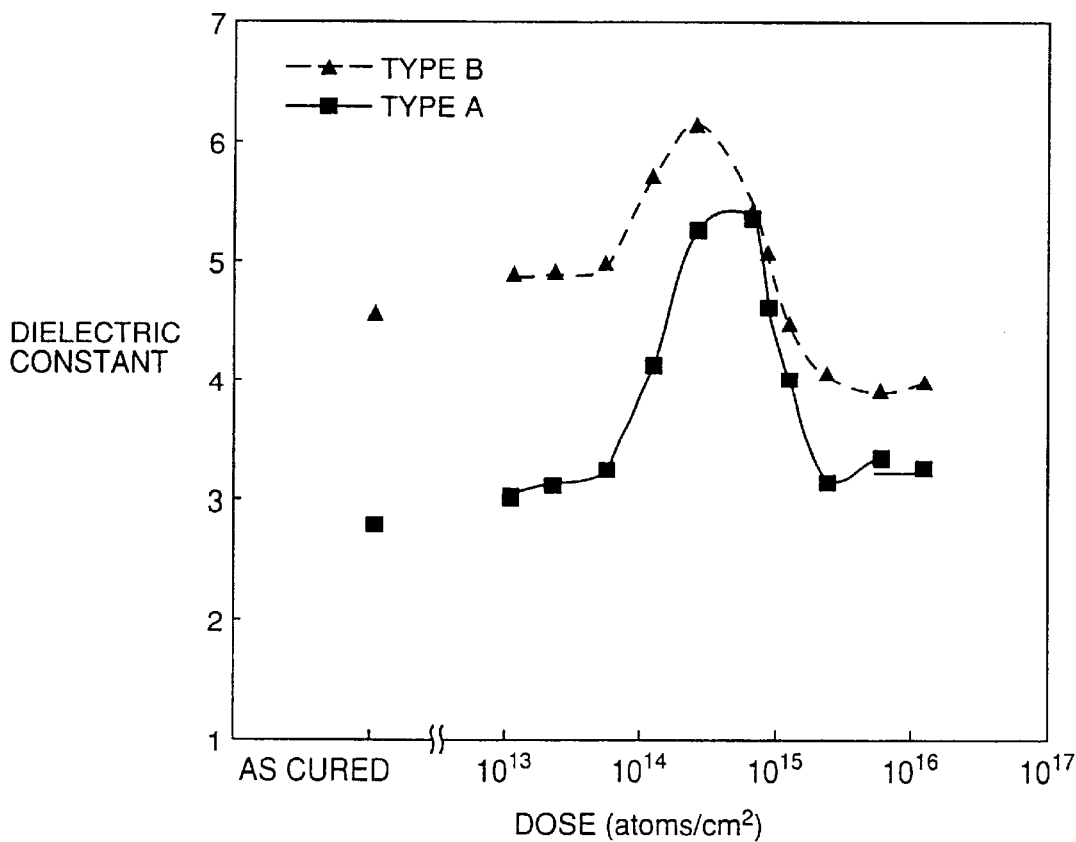

FIG. 28 shows the relationship between the dielectric constant and the amount of dose when boron ions are implanted into the organic SOG film. An organic SOG film employed in the above embodiment (type B: dotted line in drawing) and an organic SOG film with the composition of [CH$_3$SiO$_{3/4}$] (type A: solid line in drawing) are used. It is appreciated form FIG. 28 that the film of type A can have the dielectric constant suppressed.

Figure 29:
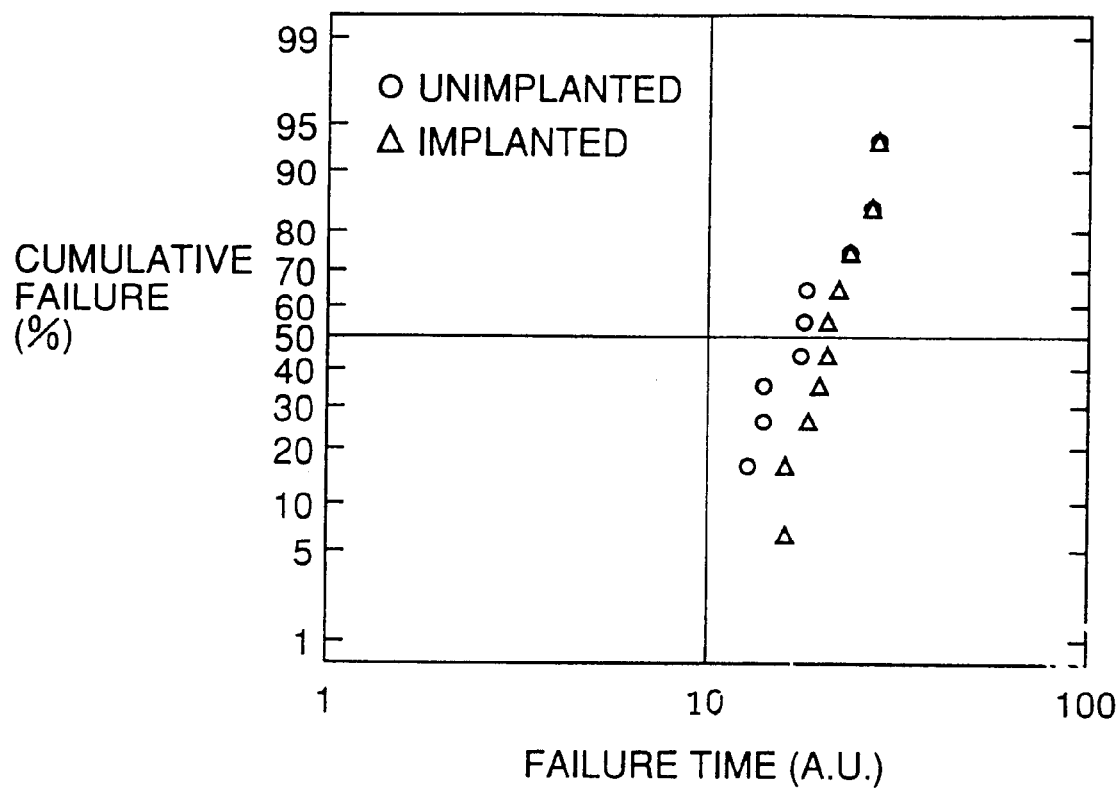

FIG. 29 shows the relationship between the cumulative failure of a Ti film and the time before disconnection (FAILURE TIME) as an index of evaluating the electromigration resistance of the Ti film when boron ions are implanted into the Ti film through the organic SOG film as in the second embodiment. It is appreciated from FIG. 29 that the film implanted with ions (IMPLANTED) maintain characteristics equal to those of a film not subjected to ion implantation (UNIMPLANTED).

The present invention is not limited to the above embodiment, and similar advantages can be achieved by implementation as set forth in the following.

(1) Polyimide or polyimide composed with siloxane can be used instead of organic SOG film 6.

(2) A silicon oxide film formed by a method other than plasma CVD can be used for silicon oxide films 5 and 8. For example, atmospheric CVD, low pressure CVD, ECR plasma CVD, photoexcitation CVD, TEOS-CVD, and PVD can be used. When atmospheric pressure CVD method is used, the gas employed is monosilane and oxygen (SiH$_4$+O$_2$). The film growth temperature thereof is not more than 400° C. The gas used for low pressure CVD is monosilane and nitrous oxide (SiH$_4$+ N$_2$O). The film growth temperature thereof is not more than 900° C.

(3) Silicon oxide films 5 and 8 can be replaced with another insulation film (such as silicon nitride film and silicate glass film) having a high mechanical strength in addition to the property of blocking moisture and the hydroxyl group. This insulation film can be formed by an arbitrary method such as CVD and PVD.

(4) Source.drain electrode 10, upper metal interconnection 23, and aluminum alloy film 53 can be formed of a conductive material other than aluminum such as an alloy of copper, gold, silver, silicide, refractory metal, doped polysilicon, titanium nitride (TiN) and titanium tungsten (TiW), and stacked layers thereof.

(5) Modified SOG film 7 can be subjected to heat treatment. In this case, the number of dangling bonds in modified SOG film 7 becomes smaller, so that the hygroscopicity and moisture permeability are further reduced.

(6) The composition of organic SOG film 6 can be substituted with that represented by the aforementioned general formula (2).

(7) The composition of organic SOG film 6 can be substituted with that represented by the aforementioned general formula (1), with ions implanted into the inorganic SOG film. In this case, the amount of moisture and hydroxyl group included in the inorganic SOG film can be reduced.

(8) Modified SOG film 7 can be used as a passivation film. In this case, a superior passivation film can be obtained that can reliably protect the device mechanically and chemically.

(9) Although boron ions are employed as impurities introduced into organic SOG film 6 in the above embodiments, any ion may be used as long as organic SOG film 6 can be modified.

Specifically, argon ions, boron ions, nitrogen ions and the like that have a relatively small mass are suitable. Particularly, boron ions are most suitable. Sufficient effect can be expected from other ions enumerated in the following.

Inert gas ions other than argon (such as helium ion, neon ion, krypton ion, xenon ion and radon ion) can be used. Since inert gas does not react with an organic SOG film 6, there is no probability of advert influence by ion implantation.

Element unitary ions of the groups IIIb, IVb, Vb, VIb, and VIIb other than boron and nitrogen, and compound ions thereof can be used. Particularly, the element unitary ions and compound ions of oxygen, aluminum, sulfur, chlorine, gallium, germanium, arsenic, selenium, bromine, antimony, iodine, indium, tin, tellurium, lead, and bismuth can be preferably used. Particularly, metal element ions can suppress the dielectric constant to a low level for organic SOG film 5 subjected to ion implantation.

Also, element unitary ions of the groups IVa, Va and compound ions thereof can be used. Particularly, element unitary ions of titanium, vanadium, niobium, hafnium, and tantalum and compound ions thereof are preferable. Since the dielectric constant of the oxide of the element of the groups IVa and Va is high, the dielectric constant of organic SOG film 6 subjected to ion implantation increases. However, this is of no particular problem in practice except for the case where an interlayer insulation film of a low dielectric constant is required.

A plurality of the types of the above-described ions can be used in combination. In this case, a further superior effect can be obtained by the synergism of each ion.

(10) In the above-described embodiments, ions are implanted into organic SOG film 6. The present invention is not limited to ions, and atoms, molecules, or particles can be introduced. In the present invention, these are generically referred to as "impurities".

(11) Sputtering is not limited to magnetron sputtering. Diode sputtering, radio frequency sputtering, tetrode sputtering and the like can be employed.

(12) The sputter etching method can be carried out without using inert gas. For example, reactive ion beam etching (RIBE: also called reactive ion milling) using reactive gas (for example, $CCl_4$, $SF_6$) can be used.

(13) Silicon oxide film 8 can be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device comprising the steps of:

forming an insulation film having a 2-layered structure of at least an upper layer and a lower layer on a metal interconnection layer formed on a semiconductor substrate, and introducing boron ions into said upper layer insulation film under a condition where boron ions pass through at least an interface between said upper layer insulation film and said lower layer insulation film and arrive at said metal interconnection layer.

2. A fabrication method of a semiconductor device comprising the steps of:

forming a metal interconnection layer on a semiconductor substrate, forming a first insulation film on said metal interconnection layer, forming a second insulation film on said first insulation film, and introducing boron ions into said second insulation film under a condition where boron ions pass through at least an interface between said second insulation film and said first insulation film and arrive at said metal interconnection layer.

3. The fabrication method of a semiconductor device according to claim 2, further comprising the step of forming a third insulation film on said second insulation film.

4. The fabrication method of a semiconductor device according to claim 2, wherein said metal interconnection layer comprises a titanium layer.

5. The fabrication method of a semiconductor device according to claim 2, wherein said metal interconnection layer comprises a main interconnection layer and a titanium layer formed on said main interconnection layer.

6. The fabrication method of a semiconductor device according to claim 2, wherein said metal interconnection layer comprises a main interconnection layer, a titanium layer formed on said main interconnection layer, and a titanium nitride layer formed on said titanium layer.

7. The fabrication method of a semiconductor device according to claim 5, wherein said main interconnection layer comprises any of aluminum and an aluminum alloy.

8. The fabrication method of a semiconductor device according to claim 2, wherein said introduction of boron ions is carried out under a condition so that the number of boron ions passing through said interface is at least $2 \times 10^{13}$ atoms/cm$^2$ and not more than $2 \times 10^{18}$ atoms/cm$^2$.

9. The fabrication method of a semiconductor device according to claim 2, wherein said second insulation film comprises a silicon oxide film including at least 1% of carbon.

10. The fabrication method of a semiconductor device according to claim 2, wherein said second insulation film includes an inorganic SOG film.

11. The fabrication method of a semiconductor device according to claim 2, wherein said first insulation film includes a film that is less hygroscopic than said second insulation film.

12. The fabrication method of a semiconductor device according to claim 2, wherein said boron ions are introduced by ion implantation.

13. A semiconductor device comprising:
- a first insulation film formed on a semiconductor substrate, and
- a second insulation film formed on said first insulation film, said second insulation film comprising a silicon oxide film including at least 1% of carbon,
- wherein boron ions are introduced to said first and second insulation films, and a profile of said boron ions is continuous at an interface between said first insulation film and said second insulation film,
- wherein the number of boron ions introduced into said first insulation film is at least $2 \times 10^{13}$ atoms/cm$^2$.

14. The semiconductor device according to claim 13, wherein said second insulation film includes an inorganic SOG film.

15. The semiconductor device according to claim 13, wherein said first insulation film includes a film that is less hygroscopic than said second insulation film.

* * * * *